United States Patent [19]
Sakai et al.

[11] Patent Number: 5,717,294
[45] Date of Patent: Feb. 10, 1998

[54] PLASMA PROCESS APPARATUS

[75] Inventors: Itsuko Sakai; Makoto Sekine; Keiji Horioka; Yukimasa Yoshida, all of Yokohama; Koichiro Inazawa, Tokyo; Masahiro Ogasawara; Yoshio Ishikawa, both of Koufu; Kazuo Eguchi, Yamanashi-ken, all of Japan

[73] Assignees: Kabushiki Kaisha Toshiba, Kawasaki; Tokyo Electron Limited, Tokyo; Tokyo Electron Yamanashi Limited, Yamanashi, all of Japan

[21] Appl. No.: 395,503

[22] Filed: Feb. 27, 1995

[30] Foreign Application Priority Data

Feb. 28, 1994 [JP] Japan ................... 6-029325
Feb. 22, 1995 [JP] Japan ................... 7-034110

[51] Int. Cl.⁶ .................. B23K 10/00; H05H 1/16
[52] U.S. Cl. .................. 315/111.41; 315/111.21; 219/121.43; 204/298.37; 156/643; 118/723 MR
[58] Field of Search ................ 204/298.16, 298.37, 204/298.2, 298.22, 298.31; 156/345, 643; 118/50.1, 621, 623, 723 MR; 315/111.41, 111.21; 219/121.4, 121.43

[56] References Cited

U.S. PATENT DOCUMENTS 4,740,268  4/1988  Bukhman .................. 156/643
5,444,207  8/1995  Sekine et al. ............. 219/121.43

FOREIGN PATENT DOCUMENTS 0 525 633 A1   2/1993   European Pat. Off. .
0 574 100 A2  12/1993   European Pat. Off. .
A 6037054      2/1994   Japan .
A 6053177      2/1994   Japan .
WO 92/21136   11/1992   WIPO .

OTHER PUBLICATIONS

Database WPI, Week 8411, Derwent Publications Ltd., London, GB; AN 84–063216 and DD–A–204 109 (Veb Zft Mikroelectr.), Nov. 1983.
Electronik, vol. 38, No. 3, Feb. 1989, Munchen De, pp. 59–62, K. Donohe, "Verbesserungen beim reaktiven Ionen-ätzen".

*Primary Examiner*—Robert Pascal
*Assistant Examiner*—Arnold Kinkead
*Attorney, Agent, or Firm*—Finnegan, Henderson, Farabow, Garrett & Dunner, L.L.P.

[57] ABSTRACT

A vacuum chamber contains a first electrode for supporting a wafer, and a second electrode opposing the first electrode. A supply system and an exhaustion system are connected to the vacuum chamber. The system supplies a reactive gas into the chamber, and the system exhaust the used gas from the chamber. A radio-frequency power supply is connected to the first electrode, for supplying power between the electrodes to generate an electric field E. An annular magnet assembly is provided around the chamber, for generating a magnetic field B which has a central plane intersecting with the electric field E. The magnet assembly has a plurality of magnet elements which have different magnetization axes in the central plane of the magnetic field. Electrons drift due to a force resulting from an outer product (E×B) of the electric field E and the magnetic field B. The central plane of the magnetic field B is shifted upwards from the target surface of the wafer, such that the magnetic force lines of the magnetic field intersect with the target surface of the substrate.

10 Claims, 17 Drawing Sheets

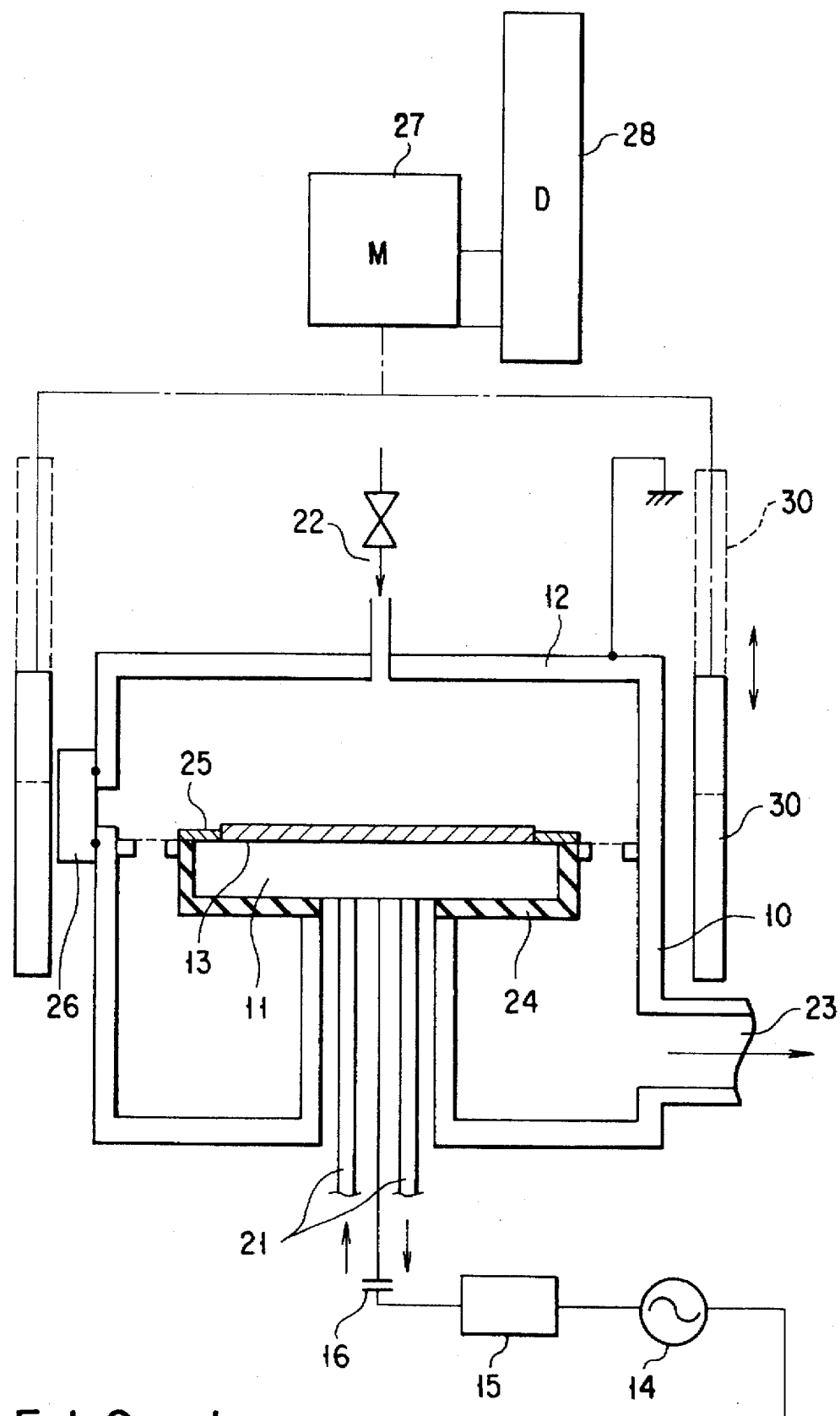
F I G. 1

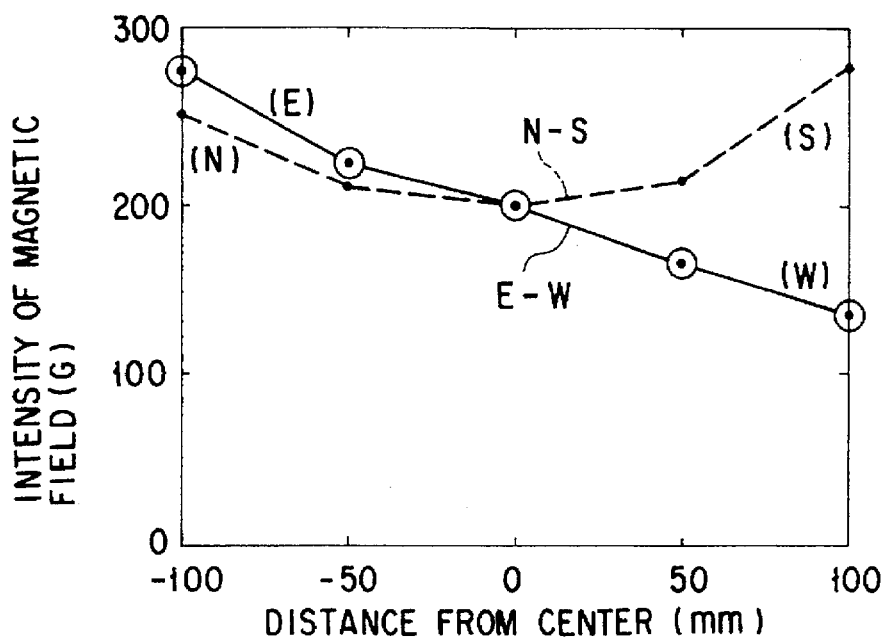
F I G. 4
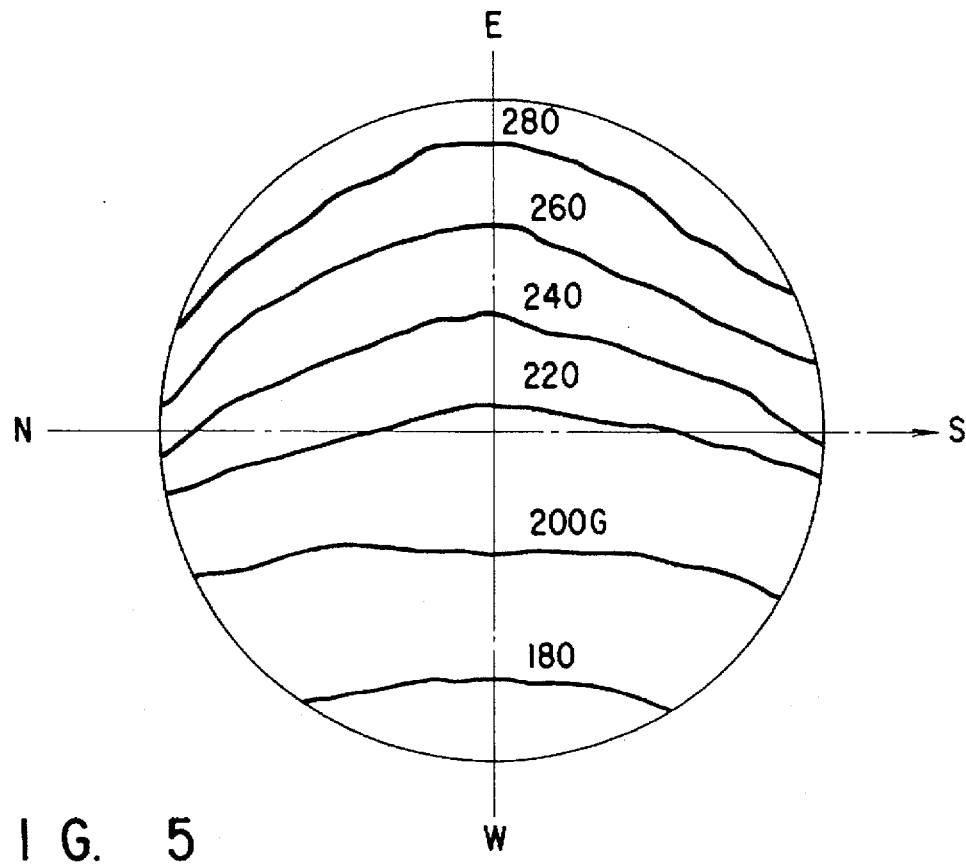
F I G. 5

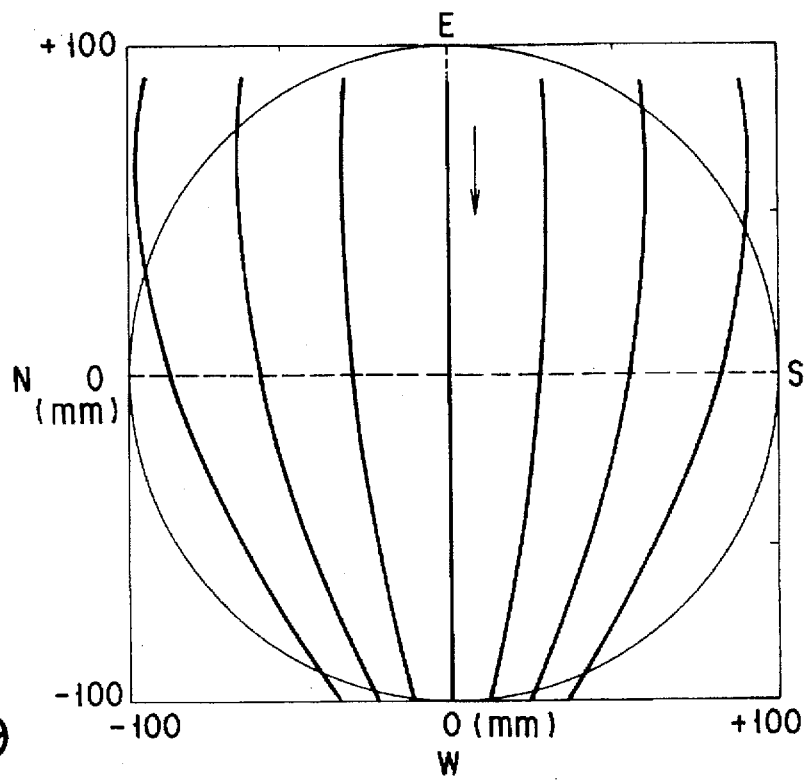
F I G. 9
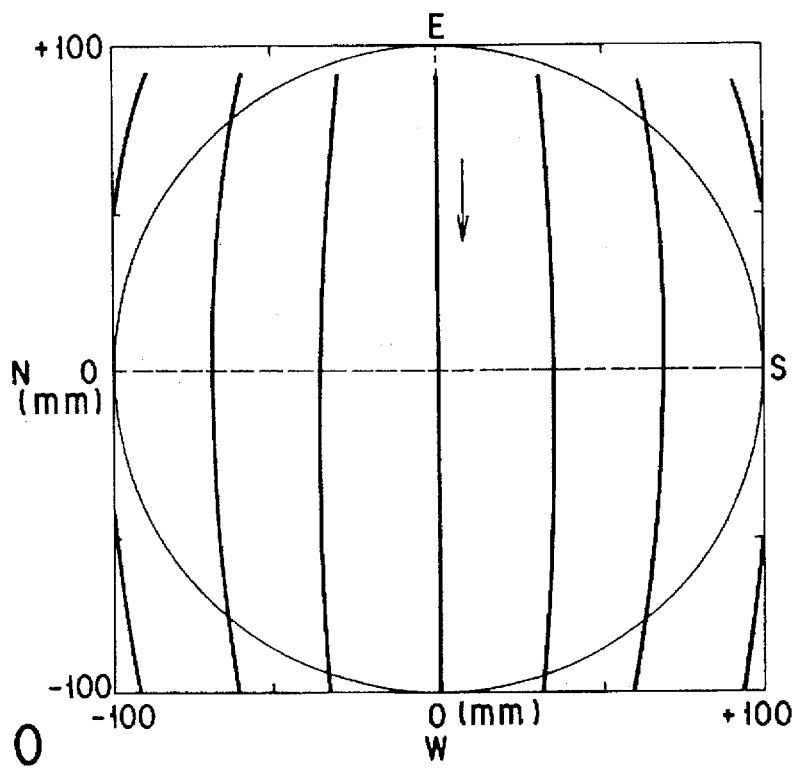
F I G. 10

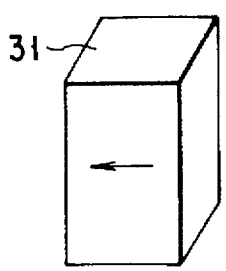
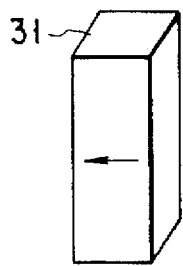
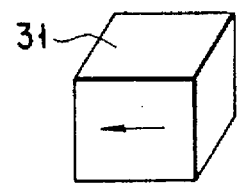
FIG. 13A      FIG. 13B      FIG. 13C
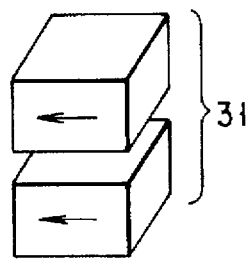
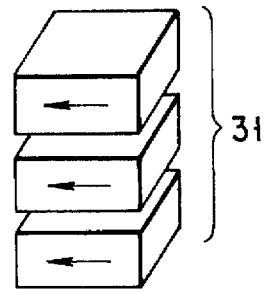
FIG. 13D      FIG. 13E
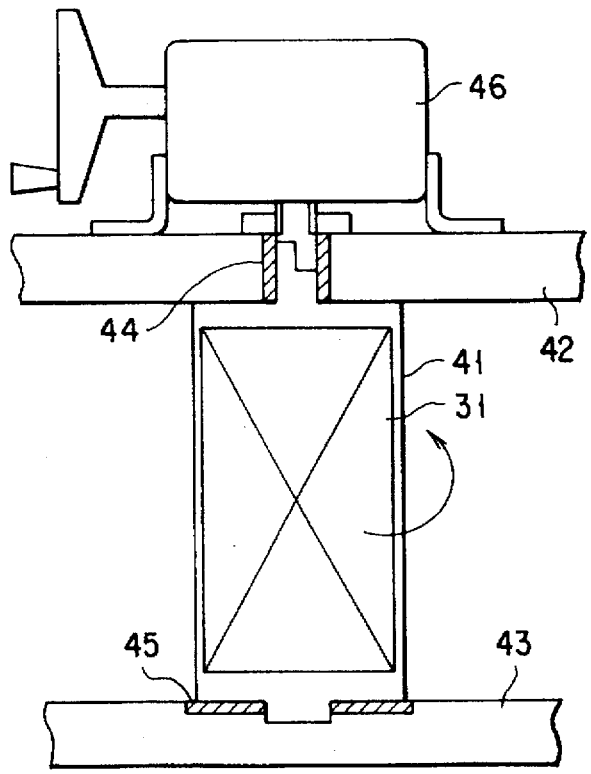
FIG. 14

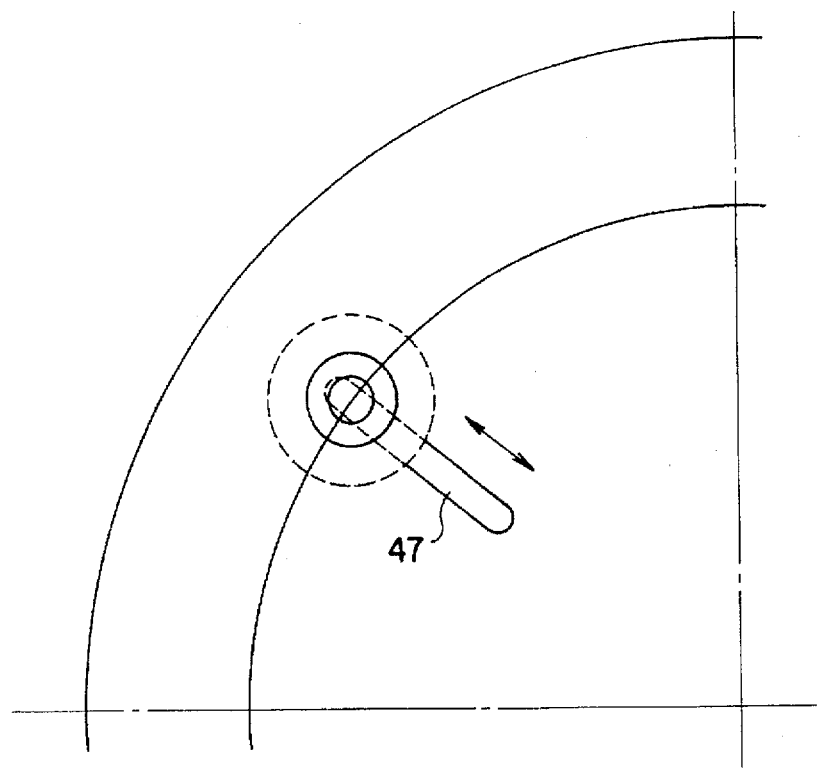
F I G. 15
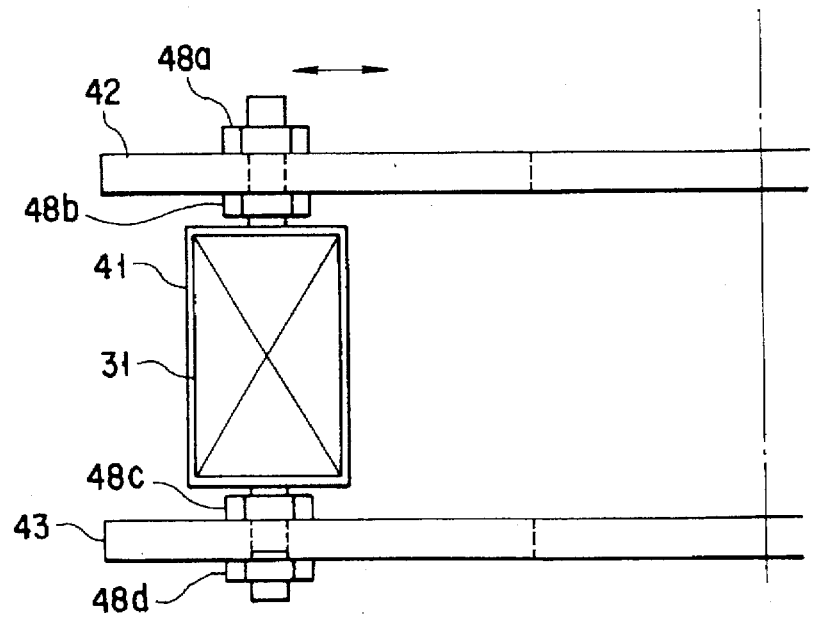
F I G. 16

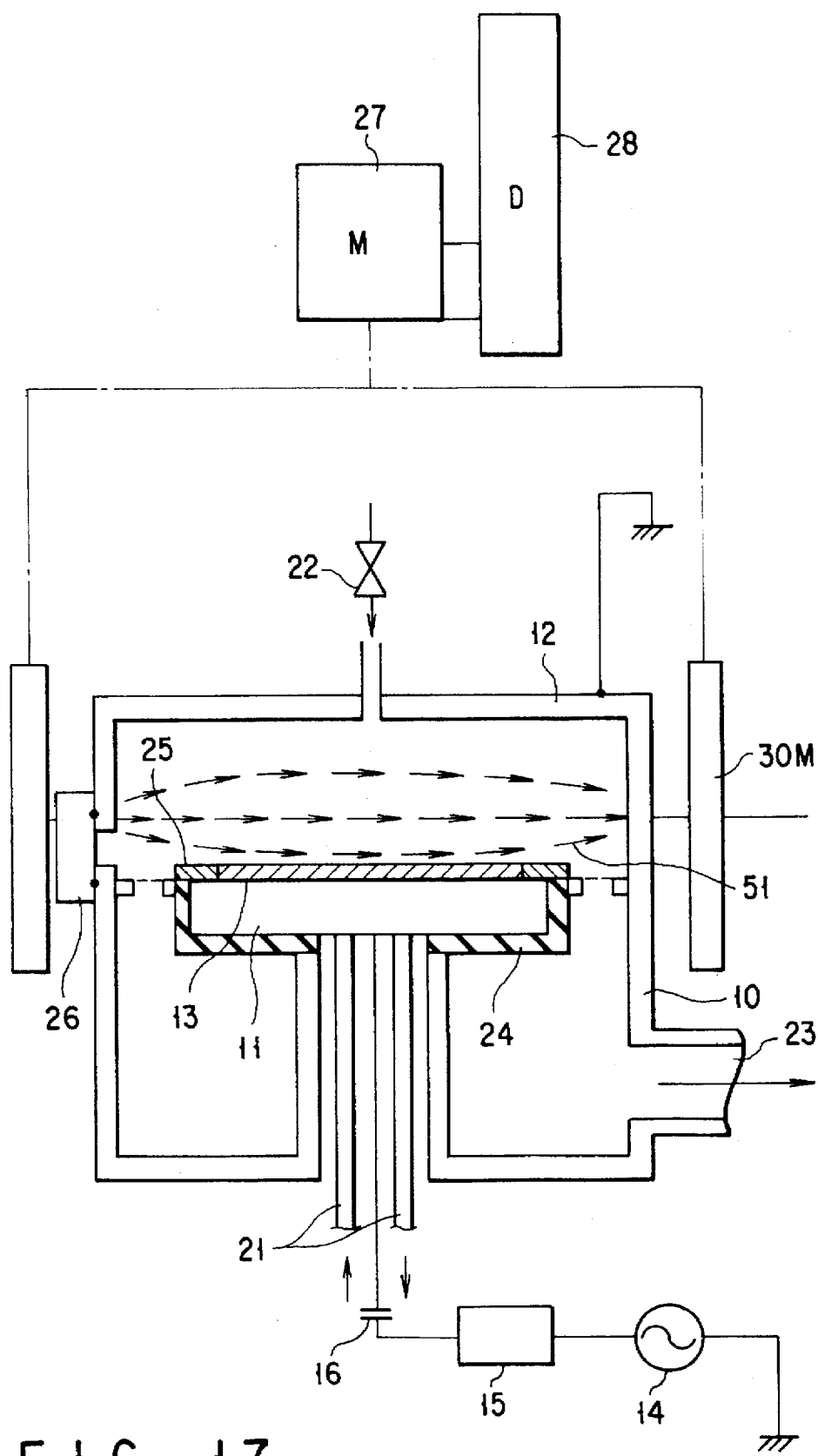
F I G. 17

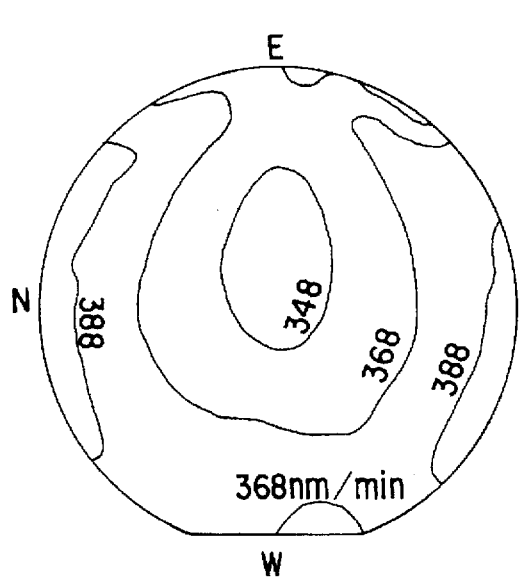
F I G. 22
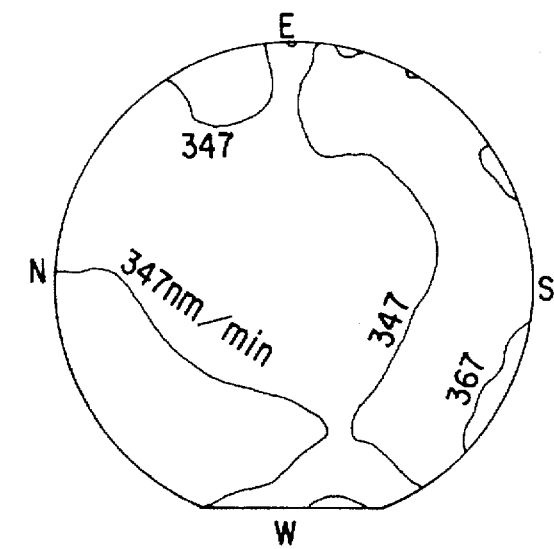
F I G. 23
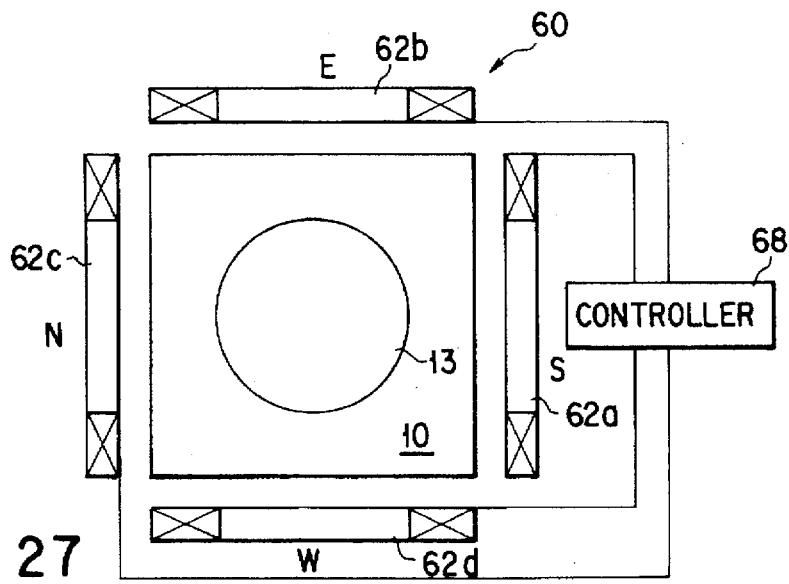
F I G. 27
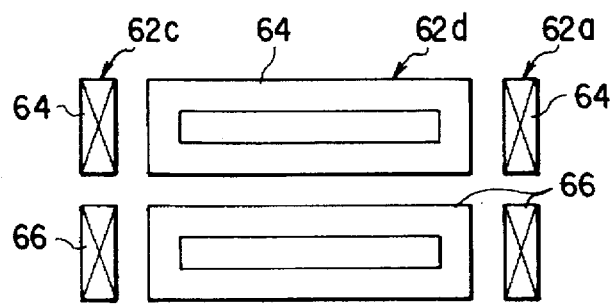
F I G. 28

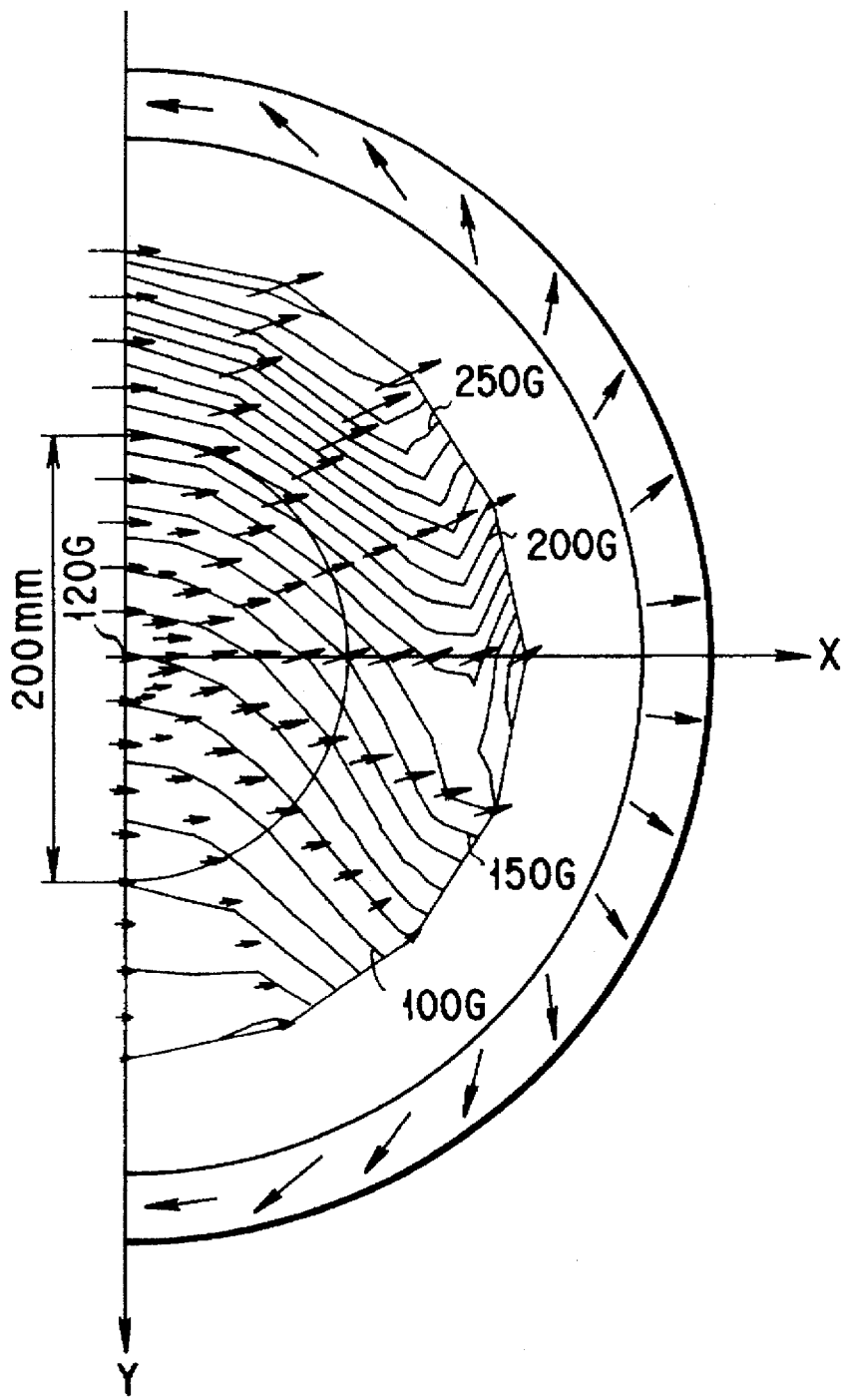
F I G. 24

PLASMA PROCESS APPARATUS

BACKGROUND OF THE INVENTION

1. Field of the Invention

The present invention relates to a plasma process apparatus, and more particularly to an etching apparatus for etching semiconductor wafers, or films formed on semiconductor wafers or LCD substrates, a CVD apparatus for forming films on such substrates, and so forth, which utilize magnetron discharge.

2. Description of the Related Art

Among the dry etching methods hitherto, used to achieve micro-processing in the manufacture of semiconductor elements is reactive ion etching (RIE). One type of the RIE method is magnetron RIE in which a magnetic field is applied to plasma, thereby performing etching at high speed.

As shown in FIG. 30, the magnetron RIE apparatus has a vacuum chamber 10, a first electrode (cathode) 11 and a second electrode (anode) 12. Both electrodes 11 and 12 are located in the vacuum chamber 10. The first electrode 11 functions as a table for supporting a substrate. The second electrode 12 is arranged, opposing the first electrode 11. Electric power is applied from a radio-frequency power supply 14 between the cathode 11 and the anode 12 through a matching circuit 15 and a capacitor 16, thereby generating a electric field. By virtue of the electric field, plasma is generated in the gap between the electrodes 11 and 12. An electric field E induced on the surface of a wafer accelerates the reactive ions in the plasma. The reactive ions impinge on the wafer, whereby etching on the wafer proceeds.

In the process of magnetron discharge, a magnet 17 applies a magnetic field B which intersects with the self-bias electric field E induced on the surface of the wafer. The lines of magnetic force are schematically represented in FIG. 30. Since the electric field E and the magnetic field B intersect with each other, the electrons in the plasma can drift in the direction W (upwards from the plane of the drawing) by Lorentz's force. This drift of electrons is known as "E×B drift."

The direction of the E×B drift is a direction in which electrons dominantly drifted due to the outer product, E×B. The electric field E is formed between the bulk of the plasma, which is generated by applying a voltage between the electrodes 11 and 12, and the wafer which is self-biased. In other words, the electric field E is formed within the sheath of the plasma. Due to the radio-frequency power applied between the electrodes 11 and 12, the outer product E×B periodically changes its direction as the direction of the electric field E changes. However, the electric field E remains directed downwards for a longer time than directed upwards. This is because a negative charge accumulates in the electrode 11 connected to the radio-frequency power supply 14. Hence, the outer product E×B remains directed from the E side toward the W side for a longer time. Thus, the electrons drift, dominantly from the E side to the W side. In the case where a radio-frequency power supply is connected to the upper electrode, the dominant direction of electron drift is the opposite. When the magnetic field B rotates, so does the direction of the E×B electron drift.

When an electron beam is made to travel in plasma for a long distance, the beam collides with neutral molecules and atoms more frequently, increasing the density of the plasma. A magnetic field is applied to the electron beam to confine the beam in the plasma, thereby to lengthen the lifetime of the beam (i.e., the time which lapses until the electrons impinge on the wall of the chamber, the electrodes and the wafer). The density of the plasma can thereby be increased.

As can be seen from the above, the magnetron RIE apparatus has excellent operating characteristics and is employed to process various kinds of thin films. The magnetic field emanating from the conventional-type magnet is, however, non-uniform in intensity. The etching rate is inevitably less constant than desired, or the lines of magnetic force intersect with the surface of the wafer at large angles. Consequently, ions travel in various directions, making it difficult to accomplish a greatly anisotropic etching.

To solve this problem it has been proposed to use a modified magnetron RIE apparatus having a dipole ring magnet which generates a magnetic field of uniform intensity (Jpn. Pat. Appln. KOKAI Publication No. 6-53177). The dipole ring magnet is an annular member, located so that it surrounds the target substrate, and has magnet elements arranged in a circle. The magnet elements are so oriented that the magnetization axes of the magnet elements rotate twice in the circle.

The dipole ring magnet generates a magnetic field whose intensity and direction are uniform over the broad surface of the cathode electrode. Thus, the use of the dipole ring magnet solves the above-mentioned problem resulting from a non-uniform intensity distribution of the conventional-type magnet. However, the E×B drift, i.e., a key to the generation of high-density plasma and a characteristic feature of the magnetron RIE method, causes non-uniform distribution of plasma density.

FIG. 31 shows a distribution of etching rate in the surface of a wafer, which is obtained by one of the structures shown in Jpn. Pat. Appln. KOKAI Publication No. 6-53177. As evident from FIG. 31, the etching rate is generally constant along the lines of magnetic force (that is, in the N-to-S direction), except for the outer circumferential edges of the wafer. Nonetheless, the etching rate greatly varies along the E-to-W axis which extends at right angles to the lines of magnetic force. The difference in etching rate, caused by the non-uniform distribution of plasma density, can be reduced by, for example, rotating the magnet. However, the ion-energy distribution is unavoidably non-uniform due to the non-uniform distribution of plasma density. As a consequence, the center and peripheral parts of the substrate have different etched shapes after the substrate has been etched by magnetron RIE method. Moreover, a difference in self-bias voltage vdc would do electrostatic damage to the gate oxide film incorporated in a MOS structure. This is a greater problem.

In Jpn. Pat. Appln. KOKAI Publication No. 6-37054, there is disclosed a system in which a magnetic filed having an intensity gradient is formed, such that the intensity is weaker at the W side than the E side, thereby suppressing a deterioration of uniformity of plasma along the E-W axis of the magnetic field. However, where a magnet is made compact or the dimensions, such as the diameter and height thereof, are made small, in order to apply the idea of the publication to a real apparatus, the magnetic field is excessively strong near the edge of a wafer at the N and S sides thereby bringing about high density regions in the plasma.

To achieve high-speed etching, a strong magnetic field may be applied, thereby to confine electrons in the plasma more effectively and to raise the plasma density. If a strong magnetic field is applied, however, the non-uniform plasma distribution will become more prominent due to the E×B drift.

A method of mitigating the non-uniform plasma distribution caused by the E×B drift in the magnetron RIE method has been proposed (Nakagawa et al, the Proceedings for the 15th Dry Process Symposium, the Society of Electric Science, Tokyo, 1993, pp. 23–26). This method utilizes a curved magnetic field. In this method, the lines of magnetic force gradually divert outwards as electrons drift. The electrons therefore diffuse outwards, too, suppressing an increase in the plasma density in the direction of drift. As a result, the plasma density is rendered uniform, whereby the etching rate and the self-bias potential are made uniform on the surface of the wafer.

In this method, the curved magnetic field is generated by changing the orientations of the N-pole and S-pole magnets which are located on the sides of a vacuum chamber, respectively. The orientations of the N- and S-pole magnets can not be adjusted with high accuracy. It is difficult to generate a magnetic field whose intensity distribution is optimal to the actual plasma density gradient. The method of applying a curved magnetic field is not so advantageous and cannot be applied widely. Since a pair of magnets which are oriented in the same direction are used, the leakage magnetic field is large, unlike in the modified magnetron RIE apparatus having a dipole ring magnet which surrounds a target substrate and which has magnet elements so oriented that the magnetizing axes of the magnet elements rotate twice in a circle. The method of applying a curved magnetic field is too problematical to employ in practice.

As described above, the conventional magnetron RIE apparatus can certainly render the magnetic field distribution extremely uniform on the surface of the wafer or within the vacuum chamber. However, the density of the plasma generated in the chamber is inevitably non-uniform due to the E×B drift of electrons. There is a demand for a method of readily eliminating any plasma-density difference and any potential difference on the wafer surface. The problem pointed out above is inherent not only in an etching process, but also in a process of forming thin films by utilizing magnetron discharge.

SUMMARY OF THE INVENTION

In view of the foregoing, it is the object of the present invention to provide a plasma process apparatus which can perform a process uniformly on the entire surface of the target surface of a substrate.

According to the invention, there is provided an apparatus for processing a target surface of a substrate, while using plasma, comprising: a vacuum chamber for defining a process space in which the substrate is contained and processed; a supply system for introducing into the vacuum chamber a gas to be made into plasma; an exhaustion system for exhausting the vacuum chamber; a first electrode located within the vacuum chamber and having a support surface for supporting the substrate such that the target surface is exposed to the process space; a second electrode having an opposing surface which opposes the support surface of the first electrode; a power supply for applying a voltage between the first and second electrodes, thereby to make the gas into plasma, and to form an electric field E which extends substantially at right angles to the target surface of the substrate supported on the support surface between the substrate and the plasma; a magnet assembly for generating a magnetic field B having a reference plane which intersects with the electric field between the first and second electrode, wherein the magnet assembly has a plurality of magnet elements which have different magnetization axes and are arranged along outer side surfaces of the vacuum chamber, electrons drift due to a force resulting from an outer product (E×B) of the electric field E and the magnetic field B, the magnetic field has a direction in the reference plane, which is parallel to the target surface of the substrate supported on the support surface, and the reference plane of the magnetic field is deviated toward the opposing surface of the second electrode, from the target surface of the substrate supported on the support surface, such that the magnetic force lines of the magnetic field intersect with the target surface of the substrate.

A preferred mode of the first aspect of the invention is as follows:

(1) The reference plane of the magnetic field intersects with the electric field substantially at right angle.

(2) A relation of $3° < \theta_{Z(\pm 100, 0)} < 8°$ holds, where $\theta_{Z(\pm 100, 0)}$ is an angle at which the magnetic force lines of the magnetic field intersect with the target surface of the substrate at a distance of 100 mm from the center of the substrate, measured along the N-S axis of the magnetic field.

(3) A relation of $1.1 \leq B_{(\pm 100, 0)}/Bc \leq 1.3$ holds, where Bc and $B_{(\pm 100, 0)}$ are intensities which the magnetic field has at coordinates (0, 0) and (±100, 0), respectively, in coordinate systems (x, y) on the target surface of the substrate, the coordinate systems (x, y) being defined with distances (mm) measured from the center of the target surface of the substrate in directions parallel to the N-S and E-W axes, respectively, of the magnetic field.

(4) A relation of $1.0 \leq B_{(\pm 100, y)}/B_{(0, y)} \leq 1.5$ holds, where $B_{(0, y)}$ and $B_{(\pm 100, y)}$ are intensities which the magnetic field has at coordinates (0, y) and (±100, y), respectively, in coordinate systems (x, y) on the target surface of the substrate, the coordinate systems (x, y) being defined with distances (mm) measured from the center of the target surface of the substrate in directions parallel to the N-S and E-W axes, respectively, of the magnetic field.

(5) A conductive or semiconductive guard ring is used for surrounding the substrate in fitting fashion. The guard ring has a surface exposed to the process space and aligned with the target surface of the substrate.

(6) Means is provided for rotating the magnetic field in a plane parallel to the target surface of the substrate.

(7) The magnetic field has such an intensity distribution that the intensity decreases in the direction in which electrons drift due to the outer product E×B.

(8) A relation of $-0.6 \leq (Br_{(0, y)} - Bo)/(Bo \times y) \leq -0.4$ holds when $-100 \leq y \leq 0$, and a relation of $-0.4 \leq (Br_{(0, y)} - Bo)/(Bo \times y) \leq -0.3$ holds when $0 \leq y \leq 100$, where y is a coordinate (mm) on the target surface of the substrate, measured from the center thereof along the direction of drift, and Bo and $Br_{(0, y)}$ are intensities which the magnetic field has at positions in the reference plane, which correspond to the center of the target surface, and the coordinate y, respectively. According to the present invention, a magnetic field is generated in the vacuum chamber. The reference plane of the magnetic field is shifted toward the surface of the opposing surface, with respect to the target surface of the substrate supported on the support surface. The magnetic force lines of the magnetic field intersect with the target surface of the substrate. The non-uniform plasma distribution occurring at the N- and S-pole sides can be mitigated. Hence, plasma greatly uniform in intensity can thereby be maintained on the entire target surface of the substrate.

According to the present invention, a magnetic field may be generated, whose intensity decreases in the direction in which electrons drift due to the outer product E×B. The non-uniform distribution of plasma density can thereby be mitigated, to maintain uniform, high-density plasma on the entire target surface of the substrate.

Therefore, in this invention a plasma potential and a self-bias voltage, both uniform in magnitude, can be applied onto the target surface of a substrate. The target surface of the substrate can therefore be uniformly surface-processed. For example, highly anisotropic etching can be performed on the substrate, without doing electrostatic damage to the target surface of the substrate. The present invention may use a plurality of magnet elements arranged in a circle, which constitute a means for generating a magnetic field. The magnetic-field generating means can be minutely controlled to adjust the distribution of the magnetic field to the actual plasma density distribution. In addition, there is little stray magnetic field outside the magnet assembly. The plasma process apparatus according to the invention is suitable for practical use.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic diagram showing a magnetron RIE apparatus according to a first embodiment of the present invention;

FIG. 4 is a graph illustrating how the magnetic field generated by the magnet assembly is distributed at the surface of a wafer, along the N-S and E-W axes;

FIG. 5 is a diagram showing the isointensity lines, representing the distribution of the magnetic field at the surface of the wafer;

FIG. 9 is a diagram showing the calculated trajectories of electrons which travel in the central plane of a uniform magnetic field;

FIG. 10 is a diagram showing the calculated trajectories of electrons which travel in the central plane of a magnetic field having an intensity gradient;

FIGS. 13A to 13E are perspective views of various magnet elements;

FIG. 14 is a side view of a mechanism for adjusting the orientation of a magnet element;

FIG. 15 is a plan view of a mechanism for adjusting the distance of a magnet element from the magnet center;

FIG. 16 is a side view of the mechanism shown in FIG. 15;

FIG. 17 is a schematic diagram showing a magnetron RIE apparatus according to a second embodiment of the present invention;

FIG. 22 is a diagram depicting the etching-rate distribution, observed when a wafer is etched, while the central plane of a magnetic field having an intensity gradient is kept aligned with the target surface of the wafer;

FIG. 23 is a diagram depicting the etching-rate distribution, observed when a wafer is etched, while the central plane of a magnetic field having an intensity gradient is shifted from the target surface of the wafer;

FIG. 24 is a view showing the intensity lines in the central plane of a magnetic field formed by a magnet, which is used for confirming an effect of the combination of an intensity gradient and an upward sift of the central plane of a magnetic filed;

FIG. 27 is a schematic plan view of the magnet assembly incorporated in a magnetron RIE apparatus according to a third embodiment of the invention;

FIG. 28 is a schematic side view of the magnet assembly illustrated in FIG. 27;

DETAILED DESCRIPTION OF THE PREFERRED EMBODIMENTS

Figure 2A:
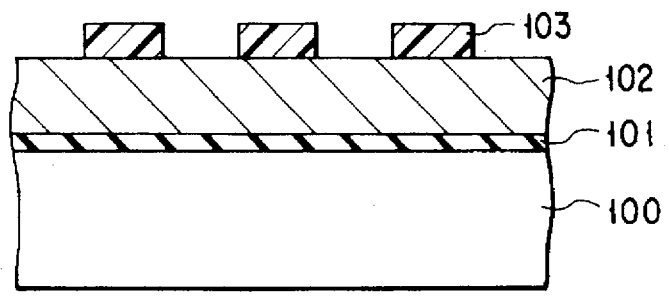
FIGS. 2A and 2B are sectional views for explaining steps of etching a polysilicon film.

FIG. 1 schematically shows a magnetron RIE apparatus according to the first embodiment of the invention.

A first electrode (cathode) 11 is located within a vacuum chamber 10, for supporting a wafer (a target substrate) 13. The top wall of the chamber 10, which opposes the first electrode 11, functions as a second electrode (anode) 12. Electric power is applied between the electrodes 11 and 12 from a radio-frequency power supply 14 through a matching circuit 15 and a capacitor 16. An annular magnet assembly 30 is provided outside the chamber 10, for generating a magnetic field extending parallel to the surface of the wafer 13.

A reactive gas is supplied into a space in which the electric field generated from the electric power applied between the electrodes 11 and 12 intersects with the magnetic field generated by the annular magnet assembly 30 and extending parallel to the surface of the wafer 13. When electrode discharge is effected, the gas is made into plasma in this space. The ions in the plasma are accelerated by the electric field induced on the surface of the wafer 13. The ions thus accelerated impinge upon the target surface of the wafer 13. The wafer 13 is thereby etched at the target surface.

The first electrode 11 which serves as a table for supporting the substrate is hollow. Cooling liquid is supplied into the hollow through a pipe 21, and drained from the hollow through a pipe 21, thus efficiently controlling the temperature of the substrate placed on the first electrode 11. The reactive gas is supplied into said space by a supply system 22, and the used gas is exhausted by an exhaustion system 23. The sides and bottom of the first electrode 11 are covered with an insulating layer 24. A guard ring 25 is mounted on the first electrode 11, surrounding in fitting fashion the wafer 13 placed on the first electrode 11. The ring 25 is made of a material selected from the group consisting of ceramics such as SiC, alumina, AlN, BN and the like, carbons of various structures, Si, organic substances, metals and alloys. The material is selected in accordance with the film to be etched and the reactive gas used.

The magnet assembly 30 has 16 magnet elements which are rod-shaped permanent magnets and which are arranged in a regular circle, as will be described later in detail. The magnet assembly 30 is rotated around the vacuum chamber 10 when it is driven by an electric motor 27. The assembly 30 is moved up and down when it is driven by a drive mechanism 28. To transfer the wafer 13 into or from the vacuum chamber 10, the magnet assembly 30 is lifted to the position indicated by the broken lines in FIG. 1. Then, the wafer is transferred through a gate valve 26 into or out of the chamber 10, using a load-lock mechanism (not shown) and a transfer mechanism (not shown).

A method in which the apparatus of FIG. 1 is used to etch a polysilicon film provided on a thin oxide film will now be explained.

First, as shown in FIG. 2A, a thin silicon oxide film 101 having a thickness of 10 nm is formed on a surface of a silicon wafer 100, and a polysilicon film 102 is formed on the silicon oxide film 101. Further, a resist pattern 103 is formed on the polysilicon film 102, so that a target object is completed. The target object is transferred into the vacuum chamber 10 and placed onto the first electrode 11, using the load-lock mechanism and the transfer mechanism. The target is secured to the first electrode 11 by an electrostatic chuck (not shown).

Figure 2B:
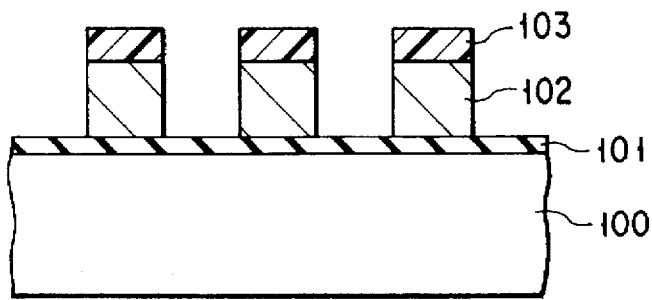

Then, the vacuum chamber 10 is evacuated by the exhaustion system 23 to about $10^{-6}$ Torr. Chlorine gas is introduced by the supply system 22 at the rate of 100 cc/min. A radio frequency power of 13.56 MHz and 250 W is applied between the first electrode 11 and the second electrode 12. At this time, the annular magnet assembly 30 is rotated at 20 rpm. The gas is exhausted by a vacuum pump through the exhaustion system 23. The conductance valve incorporated in the exhaustion system 23 is adjusted to change the pressure in the chamber to 25 mTorr. Under these conditions, the gas is made into plasma, and the silicon film 102 is etched as shown in FIG. 2B.

The etching is continued for a predetermined time to etch the target part of the polysilicon film 102 entirely. Then, the radio-frequency power supply 14 is turned off, the supply of the etching gas is stopped, and the residual gas is exhausted from the vacuum chamber 10. Thereafter, the wafer 13 is removed from the chamber 10, using the load-lock mechanism.

Figure 3:
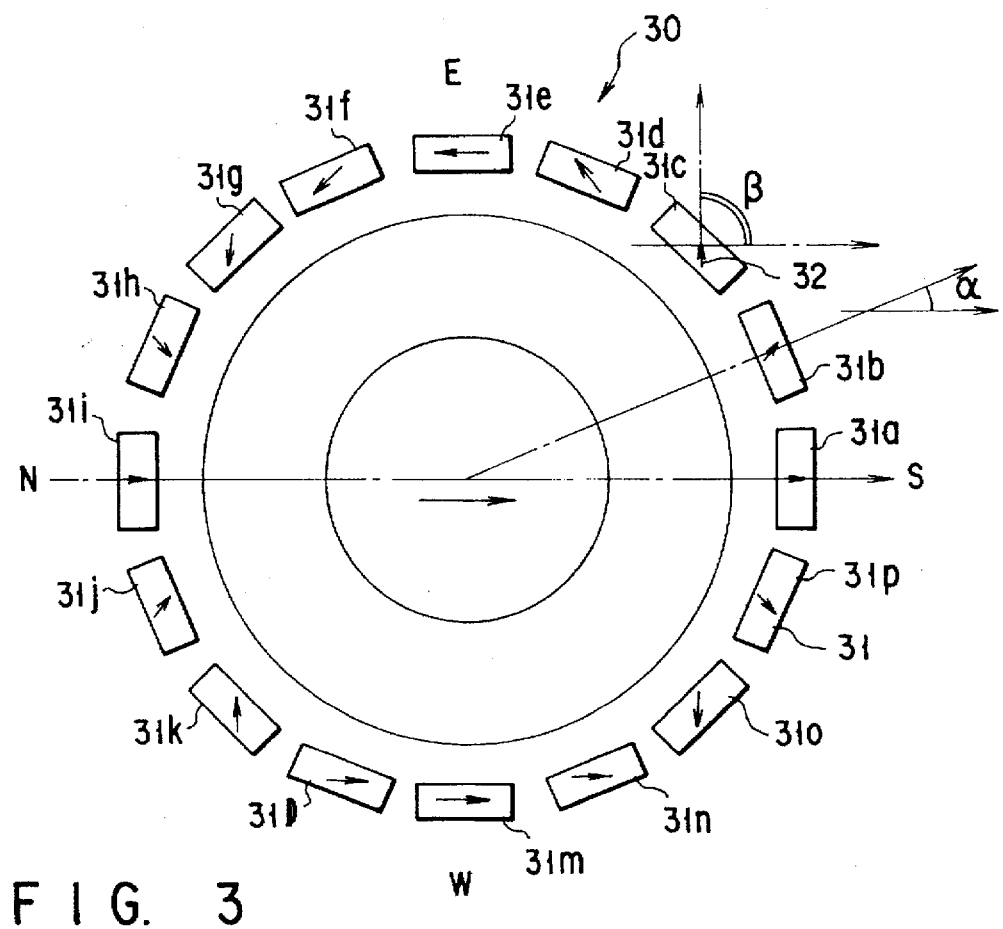
FIG. 3 is a diagram showing how magnet elements are arranged, constituting an annular magnet assembly in the apparatus of FIG. 1.

FIG. 3 shows how the 16 magnet elements 31 of the magnet assembly 30 are arranged. The magnet elements 31 are magnetized in the horizontal direction at right angles to their longitudinal axes to the same magnitude. They are located at the same distance from the center of the wafer, i.e., the target substrate, and spaced apart by the same angle $\alpha$ (22.5° pitch). The arrow 32 shown in FIG. 3 indicates the direction in which the magnetic force lines extend in each magnet element 31. The head and tail of the arrow 32 are N pole and S pole, respectively. The annular magnet assembly 30 is positioned so that the central or reference plane connecting the N and S poles of the horizontal magnetic field virtually coincides with the target surface of the substrate. The axis perpendicular to the central plane of the magnetic field passes the center of the wafer (i.e., the target object).

The magnetization axes of the magnet elements 31a to 31p arranged in a regular circle are inclined to the N-S axis by an angle $\beta$ of 0°, 45°, 90°, 135°, 180°, 225°, 270°, 315°, 0°, 45°, 90°, 0°, 0°, 0°, 270°, and 315°, respectively. Of the magnet elements 31a to 31p, the magnet elements 31a to 31k, 31o and 31p are arranged such that the magnetization axes change their orientation step by step at constant angles to cooperate with each other for forming the dominant N and S poles of the annular magnet assembly 30. The three magnet elements 31l to 31n on the W-pole side are positioned to weaken the above-mentioned dominant magnetic field.

FIG. 4 illustrates how the magnetic field generated by the magnet assembly 30 is distributed along the N-S and E-W axes, both passing the center of the wafer. FIG. 5 shows the distribution of the magnetic field at the surface of the wafer. The curves shown in FIG. 5 are isointensity lines. As clearly seen from FIGS. 4 and 5, the magnetic field has intensity of 200 Gauss (G) at the center of the wafer. It is also evident that the magnetic field has an intensity gradient which is +40% and −30% of the intensity at the wafer center, along the E-W axis which extends perpendicular to the axis of the magnetic field (i.e., the N-S axis).

As indicated above, the magnetic field generated by the annular magnet assembly 30 has an intensity gradient along the E-W axis, and is substantially uniform in both intensity and direction along the other axis. The degree of electron confinement can be adjusted in the direction of the E×B drift, and the plasma density can be made uniform on the target surface of the wafer, without suppressing an increase in the plasma density induced by the E×B drift. That is, as the electrons, which have been confined by the intense side of the magnetic field, drift in the direction of E×B drift, they enter the less intense side of the intensity of the magnetic field, so that the degree of electron confinement and the speed of the electron drift are reduced. When the degree of electron confinement is reduced, the electrons diffuse from the sheath region right above the wafer into bulk plasma. As a result of this, the increase of density, caused by the electron drift, is canceled out, whereby the plasma density becomes uniform.

The mean values of the characteristics of this magnetron RIE apparatus, such as plasma density and self-bias voltage, are similar to those of a magnetron RIE apparatus which has a conventional annular magnet assembly.

An annular magnet assembly 30 of the type shown in FIG. 3 was used, setting the intensity of the central magnetic field at the value of 200 Gauss. Further, the central plane of this magnetic field was rotated, while aligned with the target surface of a wafer. In these conditions, a polysilicon film provided on a thin oxide film was etched as has been explained with reference to FIGS. 2A and 2B. The etching rate was 320 nm/min at the center part of the wafer, and the uniformity of etching rate over the target surface of the wafer was as high as ±2%. Since the plasma per se is uniform in terms of density, no disturbance occurred in the direction in which ions moved. The target surface of the wafer was processed in its entirety. No damage to the silicon oxide film 101 (the underlayer) was observed.

As different conditions, a magnetic field having an intensity gradient was formed with the annular magnet assembly 30 such that intensities at E and W side positions having distance of 100 mm form the center of a wafer were +57% and −33%, respectively, in relation to a central intensity of 90 Gauss. With this magnetic field, an etching process was carried out, as has been explained with reference to FIGS. 2A and 2B, at pressure of 75 mTorr and radio-frequency power of 200W, while supplying HBr process gas at flow rate of 200 SCCM. As a result, the etching rate was as very much uniform as 220 nm/min +1.5%.

To etch the silicon oxide film, it is advisable to used gas containing, for example, fluorocarbon (CF). In order to achieve orienting process on a resist, gas consisting mainly of oxygen may be utilized. To etch a film of aluminum, tungsten, or the like to form wiring, gas consisting chiefly of chlorine may be applied. Using the apparatus according to this embodiment, a resist or a wiring layer on a wafer was etched with a high-performance process which did no damage to the wafer surface and which exceled in shape controllability. In view of this, the present invention is proved to be advantageous.

The desirable distribution of magnetic field intensity, which the annular magnet assembly 30 of FIG. 3 should accomplish, will now be explained in detail.

Figure 6:
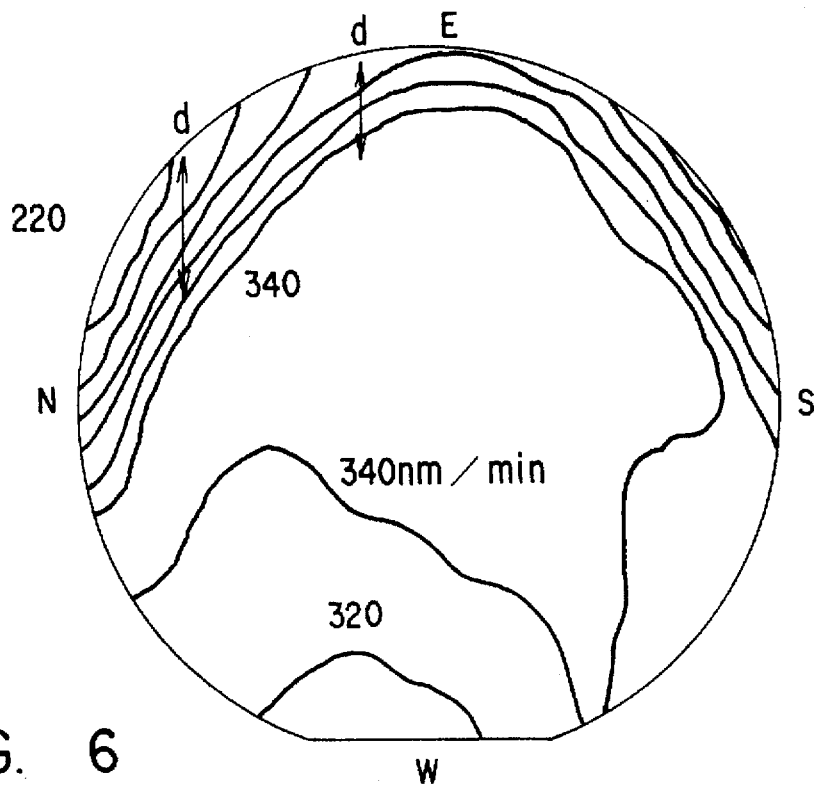
FIG. 6 is a diagram depicting the etching-rate distribution on the surface of a wafer, observed when the wafer was etched by a conventional apparatus.
Figure 7:
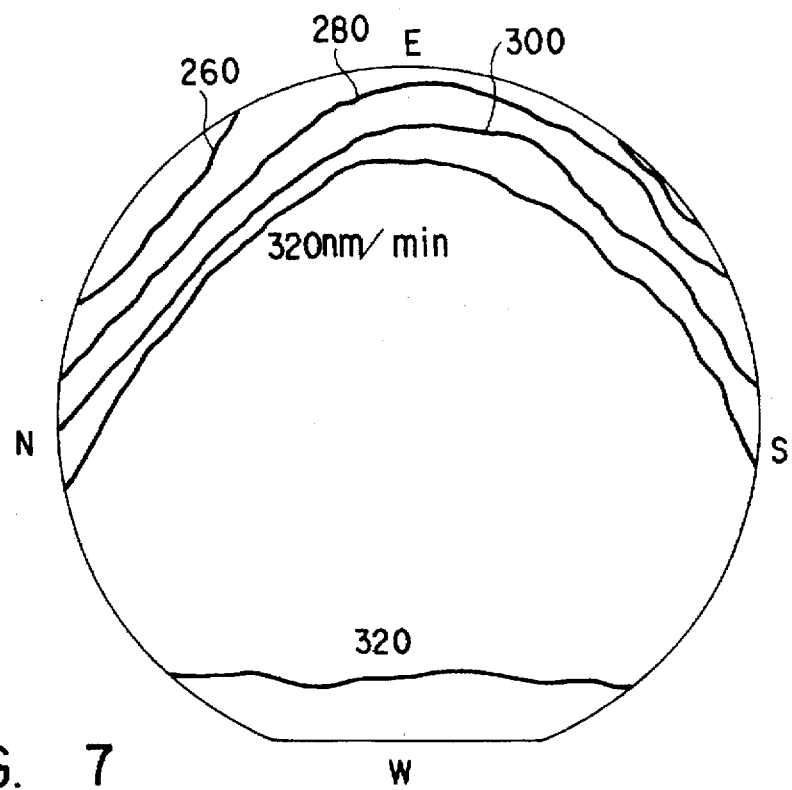
FIG. 7 is a diagram depicting the etching-rate distribution on the surface of a wafer, observed when the wafer was etched by the apparatus shown in FIG. 1.

FIG. 6 shows the etching-rate distribution on the surface of a wafer, observed when a polysilicon film on the wafer was etched by a conventional magnetron RIE apparatus. FIG. 7 depicts the etching-rate distribution on the surface of a wafer, observed when a polysilicon film on the wafer was etched by the magnetron RIE apparatus of FIG. 1. In these processes, a silicon oxide film of 1 μm thickness formed on the entire surface of a silicon substrate was etched at pressure of 40 mTorr and radio-frequency power of 2 kW, while supplying $C_4F_8$/CO/Ar process gas at flow rate of 10/50/200 SCCM. The annular magnet assembly used in the conventional RIE apparatus generated a uniform magnetic field, whereas the annular magnet assembly 30 shown in FIG. 3 generated a magnetic field having an intensity gradient. In the experiment, the intensity of the central magnetic field was set at the value of 120 Gauss, and the central plane of the magnetic field was not rotated and was aligned with the target surface of a wafer. In these conditions, polysilicon films were etched for 3 minutes in the same manner as has been explained with reference to FIGS. 2A and 2B. Dust-free carbon rings having a thickness of 3 mm were used as guard rings 25. The top of each carbon ring used was located at a level 2 mm below the target surface of the wafer.

As evident from FIG. 6 showing the results of the etching performed in the uniform magnetic field, the increase in plasma density, caused by the E×B drift, depends on the distance d (FIG. 6) for which the electrons have drifted from the edge of the wafer. Hence, the isointensity lines of the magnetic field are arcuate, strongly reflecting the circumferential shape of the wafer. Therefore, as shown in FIG. 5, the magnetic field was slightly intensified at that circumferential portion of the wafer, on the high-intensity side of the magnetic field. As a result, as shown in FIG. 7, the uniformity of etching rate over the target surface of the wafer increased from ±20% to ±12% as is evident from FIG. 7, even when the central plane of the magnetic field was not rotated.

Due to the manner of the electron drift and the circumferential shape of the wafer, the gradient of plasma density is greatest at the E side. It follows that the plasma density is apt to be lowest at the E side. It is therefore advantageous to generate a magnetic field which is most intense at the E side and least intense at the W side. Based on the results of the experiments the present inventors conducted, it was found most desired that the magnetic field be 20 to 100% more intense at the wafer edge on the E side than at the central part of the wafer, and be 0 to 50% less intense at the wafer edge on the w side than at the central part of the wafer.

It will now be explained how a magnetic field must be distributed in the direction of E×B drift in order to prevent electrostatic damage of the device formed in the wafer, particularly the electrostatic damage of the gate oxide film incorporated in a MOS structure.

To improve both the etching rate and the etching ratio which are applied in a etching process for forming a contact hole in an oxide film, the degree of dissociation of the etching gas, as well as the energy of ions, must be optimized. In view of this, it is desirable to set the intensity of the magnetic field at about 120 Gauss. The inventors conducted an experiment in which the magnetic field was set at an intensity of 100 to 140 Gauss at its central part and distributed the magnetic field in various ways, thereby performing a breakdown test on MOS capacitors.

In this experiment, a number of MOS capacitors, each having a gate oxide film of 8 nm thick and an electrode having an antenna ratio of 300,000, were formed in a thick field oxide film provided on an 8-inch wafer. The wafer, i.e., the target substrate, was located in a vacuum chamber, and the silicon oxide film was etched for 30 seconds at pressure of 40 mTorr and radio-frequency power of 2 kW, while supplying $C_4F_8$/CO/Ar process gas at flow rate of 10/50/200 SCCM. Then, 298 MOS capacitors on the wafer were examined as to breakdown voltage.

Figure 8:
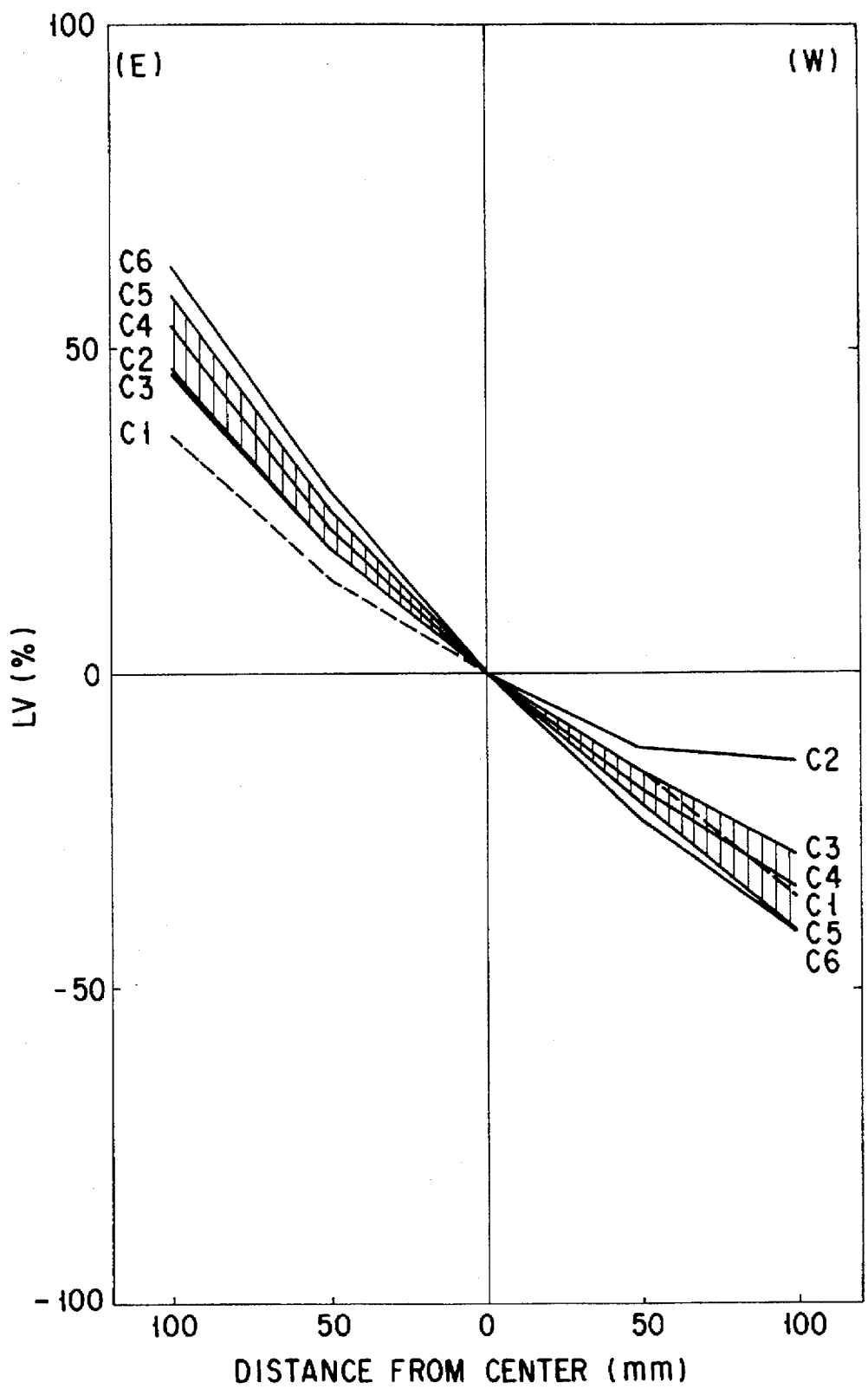
FIG. 8 is a graph representing the relation between the magnetic field distribution in the direction of the E×B drift and the degree of electrostatic damage to elements formed on a wafer.

The results were as shown in FIG. 8. Plotted on the abscissa is a distance y from the center of the magnetic field which coincided with the center of the wafer, measured in the direction of the E×B drift (i.e., along the E-W axis, the E side being minus). Plotted on the ordinate is a relative intensity LV. The intensity LV is given as: $LV=(B_{(0, y)}-Bo)/Bo$, wherein Bo is the intensity which the magnetic field has at its center and the center of the wafer, and $B_{(0, y)}$ is the intensity which the magnetic field has at the coordinates (0, y). The forward directions of X, Y and Z axes are defined as a direction from the S side to the N side, a direction from the E side to the w side, and a direction upward from the plane of the drawing, hereinafter.

The shaded part in FIG. 8 indicates an optimal region where no insulation breakdown took place. In other regions where the magnetic field had a smaller intensity gradient than in the optimal region, insulation breakdown was observed to have happened on the W side as is indicated by lines C1 and C2. In the other regions where the magnetic field had a larger intensity gradient than in the optimal region, insulation breakdown was found to have occurred on the E side as is indicated by line C6.

It was also examined how the self-bias potential Vdc was distributed on the surface of the wafer. Where the conventional dipole ring magnet generating a uniform magnetic field was used, the absolute value of the potential Vdc was large in the negative polarity at the E side than the W side, and the potential difference between the maximum and minimum was 40V within a diameter of 200 mm. As the magnetic field gradient grew stronger, the potential difference decreased, and became uniform up to 12V or less in an optimum range obtained with the experiment. Where the potential difference is small, it is possible to prevent the insulation breakdown. In contrast, where the intensity gradient was excessively strong beyond the optimum range the potential Vdc was large at the w side than the E side to increase the potential difference on the wafer, and an insulation breakdown was observed.

Let us express the above-mentioned optimal region as LV=ay, wherein a is the coefficient for the intensity gradient. Where $-100$ mm $\leq y \leq 0$ mm, it is defined that $-0.6 \leq a \leq -0.4$, and where $-0$ mm $\leq y \leq 100$ mm, it is defined that $-0.4 \leq a \leq -0.3$. Either alternative condition is proved applicable at pressure ranging from 30 mTorr to 100 mTorr, which is the pressure range generally applied to magnetron RIE method.

Since the intensity gradient of the magnetic field is set within the above-mentioned optimal region, it is possible not only to adjust the degree of electron confinement attained by applying the magnetic field, but also to moderate the concentration of electron orbits (i.e., the increase in plasma density) on the W side. This was confirmed by the calculated orbits in which electrons drift from the E side to the W side in the central plane of the horizontal magnetic field. These orbits were calculated by simulation using an apparatus having a dipole ring magnet which has a height of 150 mm and an outer diameter of 530 mm and which is designed to apply a magnetic field to a wafer having a diameter of 200 mm. FIG. 9 shows the calculated trajectories of electrons traveling in the central plane of a uniform magnetic field. FIG. 10 is illustrates the calculated trajectories of electrons traveling in the central plane of a magnetic field having the intensity gradient indicated by line C4 in FIG. 8.

Figure 11A:
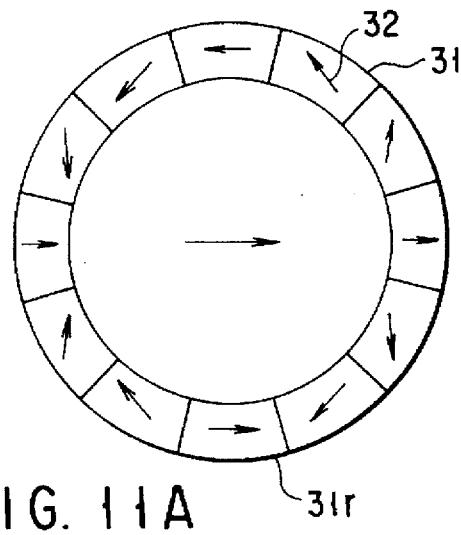
FIGS. 11A and 11B are diagrams showing modified magnet assemblies which generates a magnetic field having an intensity gradient.
Figure 11B:
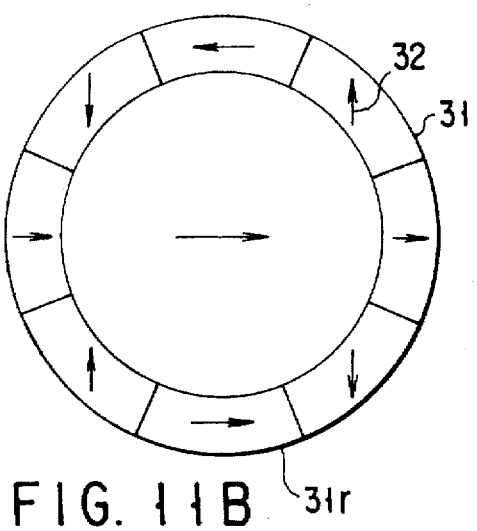

The annular magnet assembly 30 shown in FIG. 3 has 16 magnet elements 31. Nonetheless, it may be constituted by 12 magnet elements as illustrated in FIG. 11A, or eight magnet elements as exemplified in FIG. 11B. Whether the assembly 30 comprises 16, 12 or 8 magnet elements, it can generate a magnetic field whose intensity gradually decreases from the E side toward the W side. In each of the magnet assemblies of FIGS. 11A and 11B, one of the magnet elements, i.e., the element 31r, is magnetized in such a direction as to weaken the dominant magnetic field generated in the annular magnet assembly.

The intensity gradient for a magnetic field can be obtained by changing the intervals at which the magnet elements are spaced apart from one another. In this respect, FIGS. 12A and 12B show the arrangement of magnet elements 31 and the magnetizing axes of the elements 31 employed in other modified magnet assemblies.

Figure 12A:
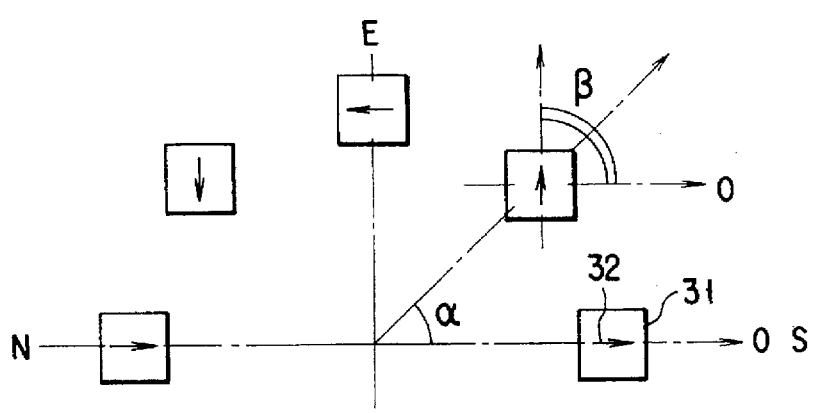
FIGS. 12A and 12B are diagrams showing other modified magnet assemblies which generates a magnetic field having an intensity gradient.

The annular magnet assembly of FIG. 12A has magnet elements 31, which generate magnetic fields of the same intensity, are located at the same distance from the center of a wafer, and are spaced apart from the S-pole side by angles α of 0°, 45°, 90°, 135° and 180°, respectively, in the counterclockwise direction. Namely, this annular magnet assembly has been manufactured by removing three of the magnet elements used in a fundamental 8-element dipole ring magnet, which are spaced apart from the S-pole side by angles α of 225°, 270° and 0°. The magnet elements 31 are arranged such that their magnetization axes are inclined at angles β of 0°, 90°, 180°, 270° and 0°, respectively, as indicated by arrows 32. The annular magnet assembly of FIG. 12A is identical to the assembly of FIG. 3 in any other aspect.

With the annular magnet assembly shown in FIG. 12A, a magnetic field was formed such that its intensity decreased from the E side to W side (in the direction of E×B drift). Although this annular magnet assembly has less magnet elements, it can generate a magnetic field having an appropriate intensity gradient while maintaining the intensity thereof.

Figure 12B:
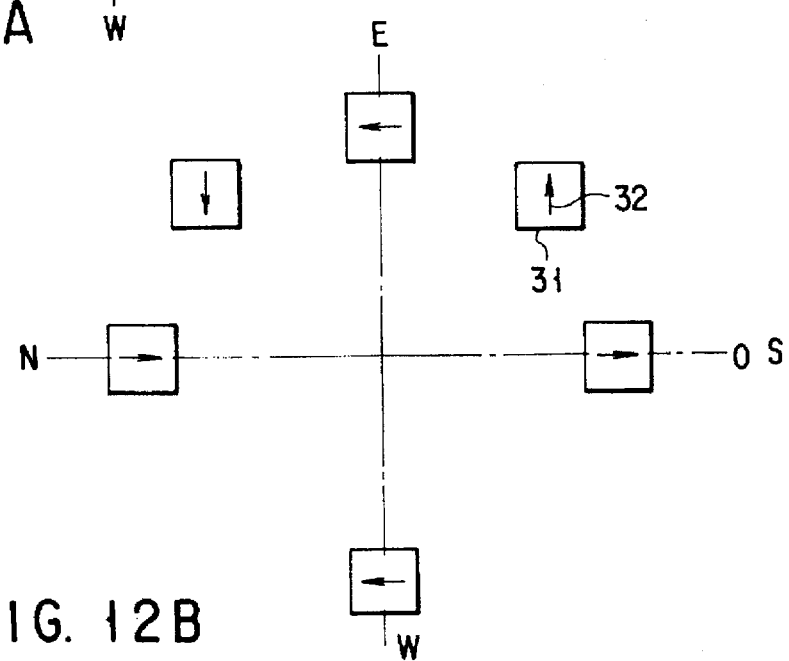

The annular magnet assembly of FIG. 12B has magnet elements 31, which generate magnetic fields of the same intensity, are located at the same distance from the center of a wafer, and are spaced apart from the S-pole side by angles α of 0°, 45°, 90°, 135°, 180° and 270°, respectively, in the counterclockwise direction. The magnet elements 31 are arranged such that their magnetization axes are inclined at angles β of 0°, 90°, 180°, 270°, 0° and 270°, respectively, as indicated by arrows 32. The annular magnet assembly of FIG. 12A is exactly the same as the assembly of FIG. 3 in any other aspect.

With the annular magnet assembly shown in FIG. 12B, a magnetic field was formed such that its intensity decreased from the E side to w side (in the direction of E×B drift). Since the magnetic fields, which the individual elements 31 generate, are set to cancel each other in relation to the outside, the leak of the magnetic field outside the apparatus is suppressed.

The magnet elements 31 need not generate magnetic fields of the same intensity. For example, the magnet element located at the intense field side, i.e., the E side, may be designed to generate a more intense magnetic field than the other magnet elements. To this end, the magnet element at the E side may either be larger than the other elements or be made of more magnetic material.

Each magnet element 31 may be changed in various ways to generate a less intense magnetic field or a more intense magnetic field. For instance, a magnetic element 31 shown in FIG. 13A may be processed into one 31 shown in FIG. 13B which is reduced in thickness measured along its magnetizing axis. Alternatively, the element 31 of FIG. 13A may be processed into one 31 shown in FIG. 13C which is reduced in length. Further, the element 31 shown in FIG. 13A may be cut into two pieces which are located one above the other, as illustrated in FIG. 13D. Still further, the element 31 of FIG. 13A may be cut into three pieces which are positioned one above another, as illustrated in FIG. 13E.

Particularly, in the case of the two-piece magnet element 31, the gap between the magnet pieces may be changed, thereby to adjust the mirror ratio, i.e., the ratio of the intensity of the magnetic field applied to the center of a substrate to the intensity of the magnetic field applied to the circumference of the wafer, near which the magnet element 31 is located. As described above, the intensity of the magnetic field decreases from the E side toward the W side, and the mirror ratio is adjusted, so that the annular magnet assembly can help to generate plasma more uniform in density.

In any annular magnet assembly described above, the magnet elements are located at the same distance from the center of the wafer. Instead, the magnet elements on the intense side of the magnetic field (i.e., the E side) may be located closer to the center of the wafer than the other magnet elements. Each magnet assembly described above has features for generating a magnetic field whose intensity decreases in the direction of E×B drift. Some features on one assembly may be combined with some features of another assembly. More specifically, any number of magnet elements may be magnetized in desired directions, may be arranged at suitable intervals, may generate magnetic fields of proper intensities, and may be located at appropriate distances from the center of the wafer, so that they cooperate to generate a magnetic field which has a intensity distribution best for an etching process.

According to the invention, the distribution of the magnetic field can be controlled by adjusting the orientations of the magnet elements 31. FIG. 14 shows a mechanism for adjusting the orientation of each magnet element.

As shown in FIG. 14, each magnet element 31 is set in a magnet case 41. The case 41 has an upper shaft and a lower shaft which protrude outwards from the opposite sides. The upper shaft is inserted in a bearing section 44 secured to an upper frame 42, and the lower shaft in a bearing section 45 secured to a lower frame 43, so that the magnet element 31 can be rotated freely. The upper shaft is coupled at its upper end to a reduction-gear mechanism 46. The mechanism 46 is fastened to the upper frame 42 and has a reduction ratio of 40:1. The magnet element 31 can be oriented in a desired direction by the mechanism 46.

A magnetron RIE apparatus having means for controlling the distribution of the magnetic field can be minutely adjusted to compensate for any change in the electron drift, which may occur when the radio-frequency power, the gas pressure, the type of gas an the like are altered to meet requirements for the best possible etching process. Such a magnetron RIE apparatus can therefore perform a high-precision processing.

Moreover, as shown in FIGS. 15 and 16 a mechanism may be provided for moving the element 31 toward and away from the center of the wafer, thereby to change the distance between the magnet element 31 and the center of the wafer and, ultimately, to minutely adjust the distribution of the magnetic field. In FIGS. 15 and 16, this mechanism comprises two slits 47 made in an upper frame 42 and a lower frame 43, respectively, and fastening nuts 48a to 48d. The both slits 71 extends in radial direction of the annular magnet assembly. The orientation-adjusting mechanism and the distance-adjusting mechanism described above may be combined.

As has been explained, the plasma process apparatus according to the first embodiment of the invention is characterized in that a magnetic field is generated whose intensity decreases in the direction in which electrons drift due to the outer product E×B. With this apparatus, the non-uniform distribution of plasma density can thereby be mitigated, and high-density plasma can thus be maintained on the entire target surface of the substrate.

FIG. 17 is a schematic diagram showing a magnetron RIE apparatus according to the second embodiment of the invention. The components of this apparatus, which are similar or identical to those shown in FIG. 1 are designated at the same reference numerals in FIG. 17 and will not be described in detail.

In the conventional magnetron RIE apparatus in general use, where a magnet, such as an annular magnet assembly, is provided around a vacuum chamber for generating a horizontal magnetic field, the central plane of the magnetic field, in which all the lines of magnetic force extend at right angles to the vertical axis of the magnet, is arranged in alignment with the target surface of a wafer. In this case, if the target surface of the wafer is not aligned with the top of the guard ring, the distribution of plasma density will be greatly affected not only by the drift of electrons, but also by the wafer edges at the E, N and S sides as shown in FIG. 6, inevitably decreasing the uniformity of etching rate over the target surface of the wafer. Conversely, if the target surface of the wafer is aligned with the top of the guard ring, the plasma density will become too high at the N-pole and S-pole sides, reducing the uniformity of etching rate over the target surface of the wafer, on the condition that the diameter of the magnet is not so big in relation to that of the wafer, and the mirror ratio of the intensity at the peripheral part of the magnet to that at the center is large.

The magnetron RIE apparatus of FIG. 17 is designed to maintain the uniformity of etching rate over the target surface of a wafer in consideration of these problems. As shown in FIG. 17, the guard ring 25, surrounding a wafer 13 in fitting fashion, is located with its top aligned with the target surface of the wafer 13. Further, the annular magnet assembly 30M is positioned such that the horizontal magnetic field generated by the assembly 30M has its central plane shifted above the target surface of the wafer 13. This is an important point, which renders the etching rate uniform over the entire surface of the wafer 13. Namely, the uniformity of etching rate over the target surface is enhanced due to the upward shift of the central plane of the magnetic field, not due to the intensity gradient of the magnetic field as in the first embodiment (FIG. 1). Although the magnet assembly 30 is designed to form a magnetic field having a uniform intensity distribution, an intensity gradient of the magnetic field as mentioned in the apparatus shown in FIG. 1 may be used in addition to the upward shift of the central plane of the magnetic field.

Figure 18:
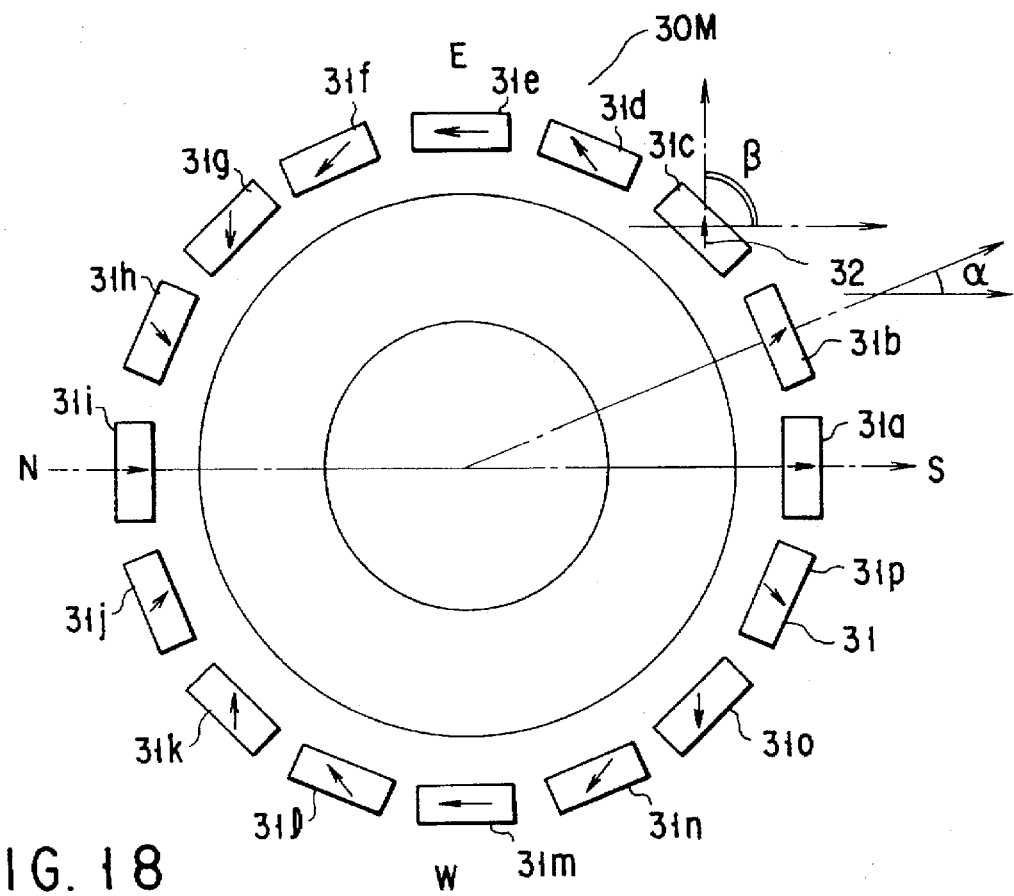
FIG. 18 is a diagram showing how magnet elements are arranged, constituting an annular magnet assembly in the apparatus of FIG. 17.

FIG. 18 is a diagram showing how 16 magnet elements 31 are arranged, constituting the annular magnet assembly 30M. The magnet elements 31 are magnetized in the horizontal direction at right angles to their longitudinal axes to the same magnitude. They are located at the same distance from the center of the wafer, i.e., the target substrate, and spaced apart by the same angle α (22.5° pitch). The arrow 32 shown in FIG. 18 indicates the direction in which the magnetic force lines extend in each magnet element 31. The head and tail of the arrow 32 are N pole and S pole, respectively. The annular magnet assembly 30 is positioned so that the central or reference plane connecting the N and S poles of the horizontal magnetic field is shifted above the target surface of the substrate.

The magnetization axes of the magnet elements 31a to 31p arranged counterclockwise, in a circle, are inclined to the N-S axis by an angle β of 0°, 45°, 90°, 135°, 180°, 225°, 270°, 315°, 0°, 45°, 90°, 135°, 180°, 225°, 270°, and 315°, respectively, such that they change their orientation step by step at constant angles. In other words, any two magnet elements arranged diametrically opposite to each other are magnetized in the same direction, and hence cooperate to form the N and S poles which are dominant in the annular magnet assembly 30M.

Figure 19:
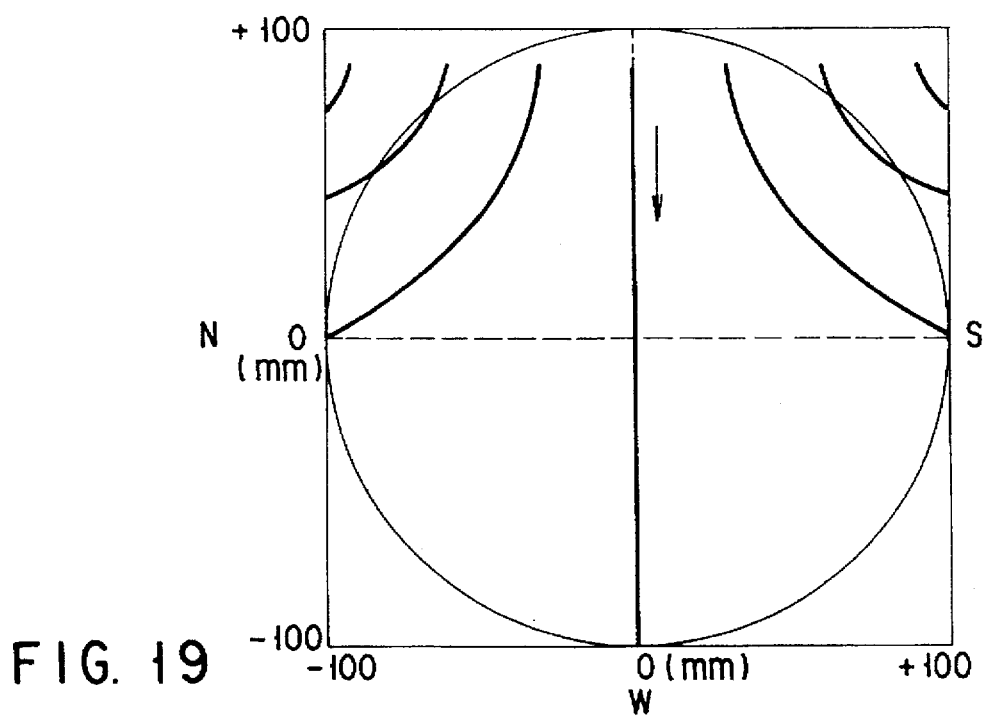
FIG. 19 is a diagram showing the calculated orbits in which electrons travel in a plane of a magnetic field having no intensity gradient, which is remote from and parallel to the central plane of the magnetic field.

Since the central plane of the horizontal magnetic field is located above the target surface of the wafer 13, the lower parts of U-shaped lines of magnetic force pass through the target surface of the wafer 13. The trajectories of electrons drifting due to outer product E×B curve outwards as they approach the N and S sides of the wafer 13. This is because the vertical component of the magnetic field provides the electrons with an outward force while they are drifting under Larmor motion. To ascertain the mechanism of moving the electrons, the orbits of the electrons drifting from the E side toward the W side were calculated through simulation using an apparatus having a dipole ring magnet which has a height of 150 mm and an outer diameter of 530 mm and which is designed to apply a magnetic field to a wafer having a diameter of 200 mm. The results of the calculation were as shown in FIG. 19. The orbits calculated are obviously different from those shown in FIG. 9.

In the second embodiment, a mechanism may be used to move the annular magnet assembly 30M up and down, thereby to minutely adjust the distribution of the magnetic field in accordance with the process which is to be performed on the wafer. Alternatively, a mechanism may be provided for each magnet element 31, to move the magnet element 31 vertically, thereby to minutely adjust the distribution of the magnetic field. Further, to incline the lines of magnetic force at the circumferential part of the wafer, the magnet elements 31 may be tilted inwards or may have magnetization axes tilted inwards.

Figure 20:
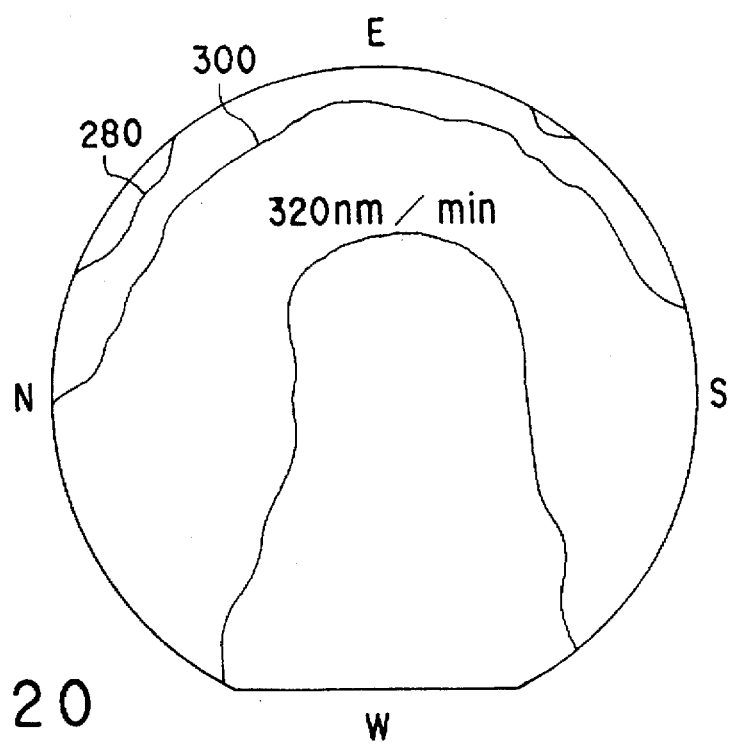
FIG. 20 is a diagram depicting the etching-rate distribution on the surface of a wafer, observed when the wafer was etched by the apparatus shown in FIG. 17.

FIG. 20 is a diagram representing the etching-rate distribution on the surface of a wafer, observed when the wafer was etched by the magnetron RIE apparatus shown in FIG. 17 in the same way as in the cases shown in FIGS. 6 and 7. In this experimental etching, the annular magnet assembly 30M was driven to generate a magnetic field whose intensity was 120 gausses at its center. The central plane of the magnetic field was located 20 mm above the target surface of the wafer and not rotated. In these conditions, a polysilicon film on the wafer was for 3 minutes in the same manner as has been explained with reference to FIGS. 2A and 2B. As the guard ring 25, dust-free carbon ring having the top surface aligned with the target surface of the wafer was used. As is evident from FIG. 20, the uniformity of etching rate over the target surface increased to ±8%.

Under the conditions of this experimental etching, the lines of magnetic force inclined 6° upward and downward at the distance of 100 mm from the center of the wafer. However, the intensity of the magnetic field and the magnitude of the vector component extending along the E-W axis scarcely changed. This is perhaps because the magnetic field had a small intensity gradient at the edges of the wafer, mitigating the influence of the wafer edges.

The second embodiment of the invention will be further described, with regard to the measures taken to prevent electrostatic damage to a device formed in the wafer, particularly electrostatic damage to the gate insulting film of a MOS device.

Figure 21:
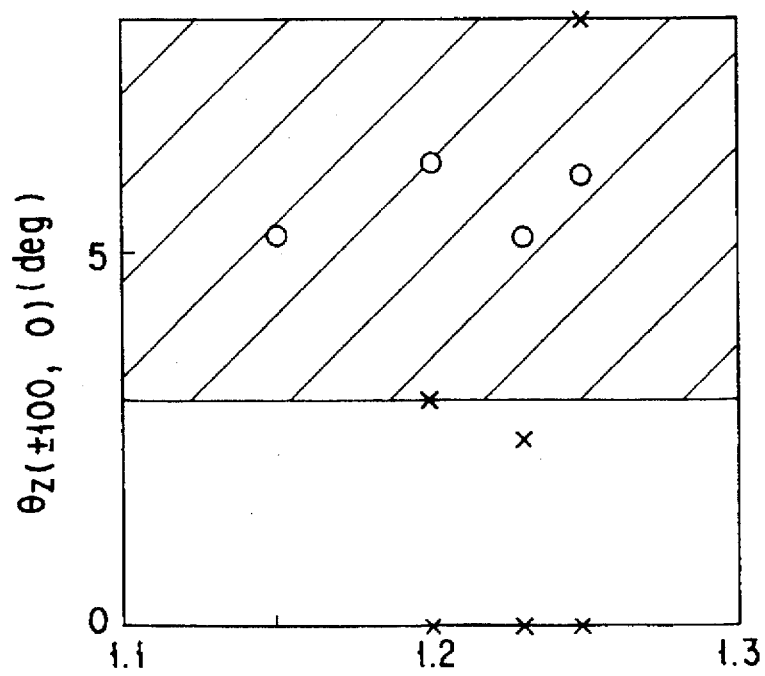
FIG. 21 is a diagram showing how the etching rate distribution and the electrostatic damage to devices formed on a wafer depends upon the mirror ratio measured along the N-S axis and the angles of magnetic force lines to the wafer.

If the central plane of the magnetic field is shifted upward with respect to the target surface of the wafer, the angle at which the magnetic force lines intersect with the wafer will change. The density of the plasma are greatly influenced by this intersection angle and the ratio between the intensities of the center and periphery of the magnetic field (i.e., the mirror ratio). FIG. 21 shows the results of the experiment wherein distributions of etching rate on wafers and electrostatic damages to wafers were examined by varying the mirror ratio $R_{(\pm 100, 0)}$ ($=B_{(\pm 100, 0)}/Bc$) along the N-S axis and the intersection angle $\theta_{Z(\pm 100, 0)}$ of the magnetic force line. Here, Bc is the intensity the magnetic field has at the center of the target surface of the wafer, $B_{(\pm 100, 0)}$ is the intensity the magnetic field has at the coordinate of 100 (mm) from the center of the target surface, as measured along the N-S axis. The intersection angle $\theta_{Z(\pm 100, 0)}$ is one at the coordinates (±100, 0) on the target surface.

In this experiment, a number of MOS capacitors, each having a gate oxide film of 8 nm thickness and an electrode having an antenna ratio of 300,000, were formed in a thick field oxide film provided on an 8-inch wafer. The wafer, i.e., the target substrate, was located in a vacuum chamber, and a process, imaging an over etching during formation of contact holes in the silicon oxide film, was performed for 1 minute at central magnetic-field intensity of 120 gausses, pressure of 40 mTorr and radio-frequency power of 2 kW, while supplying $C_4F_8$/CO/Ar process gas at flow rate of 10/50/200 SCCM. Then, the MOS capacitors were examined as to breakdown voltage.

In FIG. 21, each circle (O) indicates the conditions under which no electrostatic damage occurred and uniformity of etching rate was excellent, and each cross (X) indicates the conditions under which an electrostatic damage took place or uniformity of etching rate was bad. As shown in FIG. 21, the wafer can be etched without suffering from electrostatic damage if the central plane of the magnetic field is positioned in relation to the target surface of the wafer so as to meet the following requirements:

$1.1 \leq R_{(\pm 100, 0)} \leq 1.3$, and $3° < \theta_{Z(\pm 100, 0)} < 8°$

Further, the inventors conducted an experiment on the insulation breakdown of a gate oxide film formed on a wafer for a mirror ratio $R_{(\pm 100, y)} = B_{(\pm 100, y)}/B_{(0, y)}$ in a range of $-100 \leq y \leq 100$, in addition to the mirror ratio $R_{(\pm 100, 0)}$ at the coordinates (±100, 0). As a result, it has been found that the following condition is always preferable:

$1.0 \leq R_{(\pm 100, y)} \leq 1.5$

Figure 25:
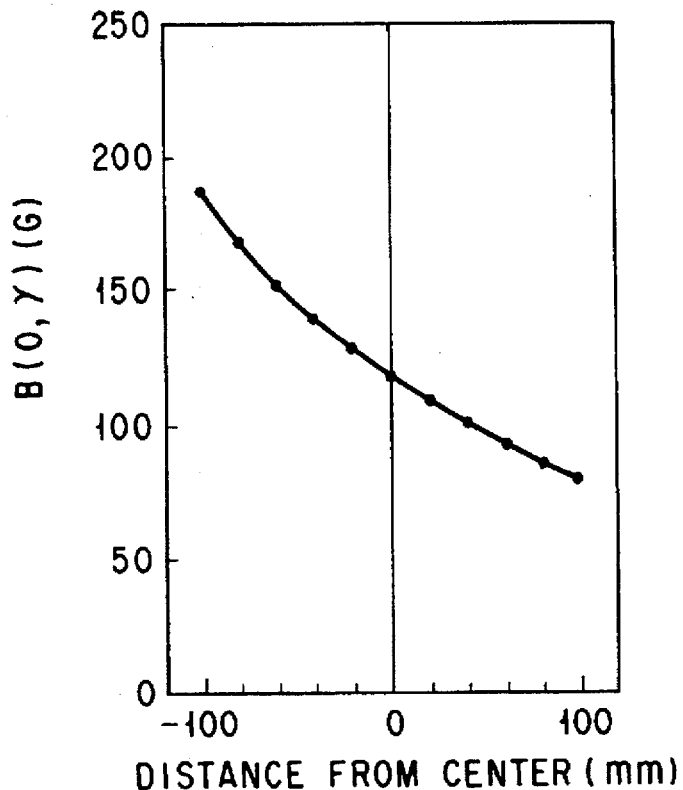
FIG. 25 is a graph showing the intensity gradient of the magnetic field shown in FIG. 24.
Figure 26:
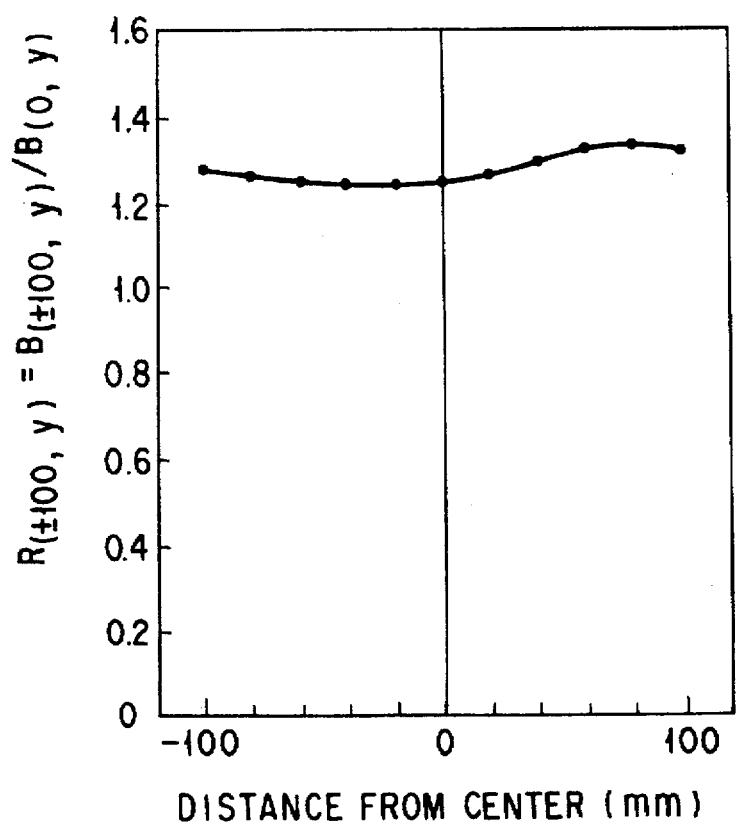
FIG. 26 is a graph showing the distribution of a mirror ratio of the magnetic field shown in FIG. 24.

In order to confirm an effect of the combination of an intensity gradient used in the first embodiment and an upward sift of the central plane of a magnetic filed used in the second embodiment, the inventors conducted an experiment in which a silicon oxide film was etched. FIGS. 24, 25 and 26 show the intensity distribution of a magnetic field used in this experiment. FIG. 22 and 23 show the distributions of etching rates obtained in this experiment.

FIG. 24 is a view showing the intensity lines in the central plane of the magnetic field formed by a used magnet. FIG. 25 is a graph showing the intensity gradient of the magnetic field along E-W axis, which satisfies the conditions described with reference to FIG. 8. FIG. 26 is a graph showing the distribution of the mirror ratio $R_{(\pm 100, y)}$ of the magnetic field in a range of $-100 \leq y \leq 100$, which always satisfies the condition of $1.0 \leq R_{(\pm 100, y)} \leq 1.5$. The magnetic filed was formed by using magnet elements shown in FIG. 13D in which each elements was divided into two portions. The height and the gap length of each magnet element were adjusted to form the distribution of the mirror ratio shown in FIG. 26.

In the experimental etching the results of which are shown in FIG. 22, the central plane of the magnetic field was aligned with the target surface of the wafer and also with top surface of the carbon ring 25. In the experimental etching the results of which are shown in FIG. 23, the central plane of the magnetic field was shifted 20 mm upwards from the target surface of the wafer aligned with top surface of the carbon ring 25. In either experimental etching, the annular magnet assembly of FIG. 25 was used, generating a magnetic field having an intensity gradient, and the magnetic field was not rotated.

In the experiment which yielded the results shown in FIGS. 22 and 23, used were a wafer consisting of a silicon substrate on which an oxide film of 1 μm thickness was formed entirely, and a wafer which was prepared such that a number of MOS capacitors, each having a gate oxide film of 8 nm thickness and an electrode having an antenna ratio of 300,000, were formed in a thick field oxide film provided on an 8-inch wafer. The wafer, i.e., the target substrate, was located in a vacuum chamber, and the silicon oxide film was etched for 1 minute at central magnetic-field intensity of 120 gausses, pressure of 40 mTorr and radio-frequency power of 2 kW, while supplying $C_4F_8/CO/Ar$ process gas at flow rate of 10/50/200 SCCM.

The uniformity of etching rate over the surface of the wafer increased to ±8% in the case of the wafer shown in FIG. 22, and to ±5% in the case of the wafer shown in FIG. 23. The magnetic field was rotated at the speed of 20 rpm under the same conditions as in the etching of the wafer shown in FIG. 23, the uniformity of etching rate over the surface of the wafer further increased to ±3%. The wafers processed in these experimental etching were put to breakdown test. No electrostatic damages had not occurred.

When the target surface of the wafer is aligned with the top of the guard ring 25 and a magnetic field having an intensity gradient was applied, the uniformity of etching rate over the target surface in the E-W axis of the wafer is improved as can be understood from FIG. 22. Even in this case, where the magnet assembly is made compact, as this example in which the magnet assembly has an inner diameter of 460 mm, and a height of 120 mm in relation to a wafer of 200 mm, the mirror ratio of the peripheral part of the wafer to the center becomes more than 1. Since this example shows $R_{(\pm 100, y)} = 1.25$, it is not possible to prevent the etching rate from being excessively high at the N and S sides. To reduce the etching rate at the N-pole and S-pole sides, the central plane of the magnetic field may be shifted upwards. Then, the uniformity of etching rate over the target surface can be more improved, as can be seen from FIG. 23. Although the apparatus needs to be complex in structure, the rotation of the magnetic field effectively serves to enhance the uniformity of etching rate over the target surface.

As has been described, it is possible to provide an excellent uniform characteristic over the entire target surface, while using a compact magnet suitable for a real apparatus, by preferably setting the intensity gradient of a magnetic field, the curved degree of magnetic force lines, and the distribution of mirror ratios.

FIG. 27 is a plan view of the magnet assembly incorporated in a magnetron RIE apparatus according to the third embodiment of the invention, more precisely illustrating the positional relation between the magnet assembly and the vacuum chamber. FIG. 28 is a side view of the magnet assembly incorporated in this magnetron RIE apparatus.

The magnetron RIE apparatus according to the third embodiment differs from the apparatus according to the second embodiment (FIG. 17), in that a magnetic assembly 60 having electromagnets is used in place of the annular magnetic assembly 30M. The magnet assembly 60 comprises four magnet elements 62a to 62d which surround a vacuum chamber 10 and which perform substantially the same function. Each of the magnet elements 62a to 62d has two electromagnetic coils 64 and 66 which are arranged one above the other and which perform virtually the same function. A controller 68 applies AC voltages having predetermined phases to the magnetic coils of the magnet elements 62a to 62d. The magnet assembly 60 generates a magnetic field of uniform intensity distribution, or a magnetic field having no intensity gradient. The central plane of the magnetic field is shifted 10 mm upwards from the target surface of a wafer 13.

AC voltages which are phase-shifted by 90° from each other are applied to the magnet elements 62a and 62b. An AC voltage of the same phase as the AC voltage applied to the magnet element 62a is applied to the magnet element 62c. An AC voltage of the same phase as the AC voltage applied to the magnet element 62b is applied to the magnet element 62d. Hence, the magnet assembly 60 generates a rotating magnetic field. The magnetron RIE apparatus shown in FIG. 27 need not have a component equivalent to the electric motor 27 shown in FIGS. 1 and 17.

FIGS. 29A to 29D illustrate the results of experimental etching performed to demonstrate the advantages of the magnetron RIE apparatus shown in FIGS. 27 and 28.

In this experimental etching, 8-inch wafers, each having a silicon oxide film formed on it, were used as a target substrate. The silicon oxide film on each wafer was subjected to sputter-etching for 3 minutes at pressure of 100 mTorr and radio-frequency power of 700W, while supplying process gas, Ar, at flow rate of 100SCCM. For experimental purpose, DC voltages were applied to the electromagnetic coils 64 and 66 of the magnet elements 62a and 62c, and no voltages were applied to the electromagnetic coils 64 and 66 of the magnet elements 62b and 62d, in order not to rotate the magnetic field generated by the magnet assembly 60. Nor guard rings 25 were utilized at all. Therefore, the circumferential part of the wafer was located below the target surface of the wafer.

Figure 29A:
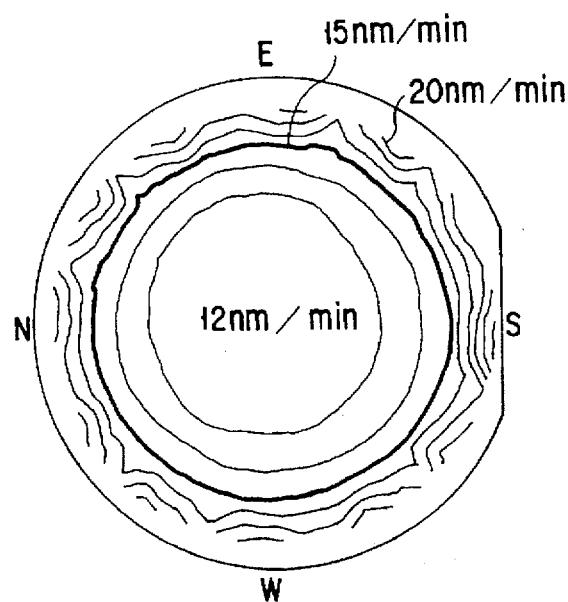
FIGS. 29A to 29D are diagrams illustrating the results of experimental etching performed to demonstrate the advantages of the magnetron RIE apparatus according to a third embodiment.
Figure 29B:
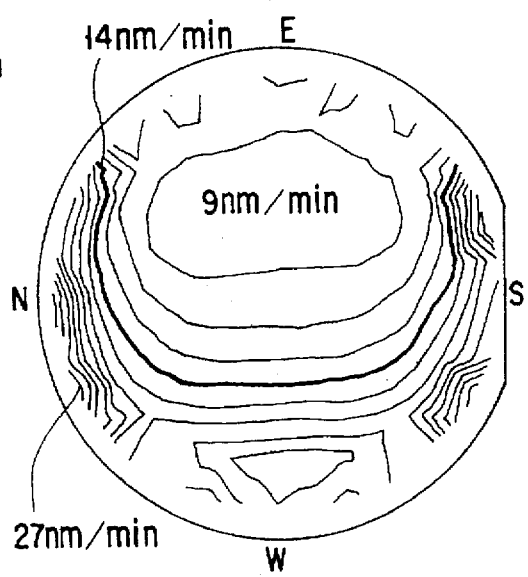
Figure 29C:
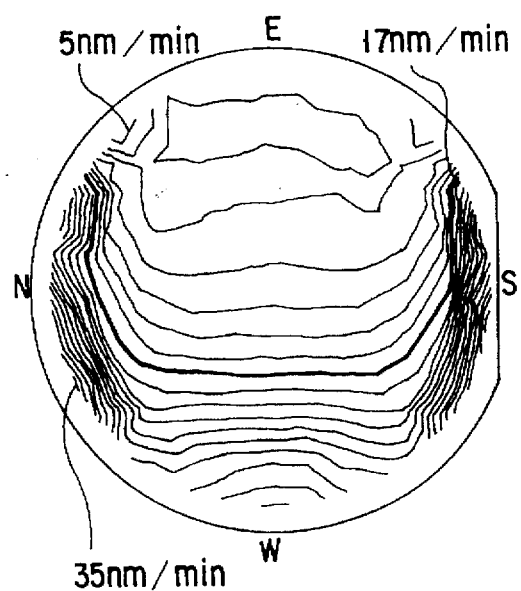
Figure 29D:
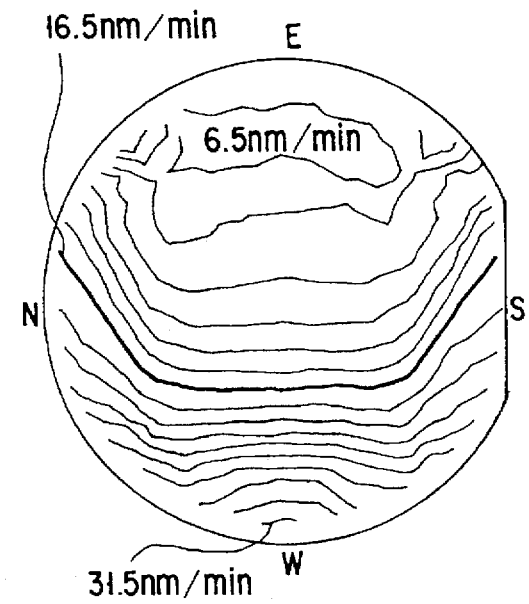
Figure 30:
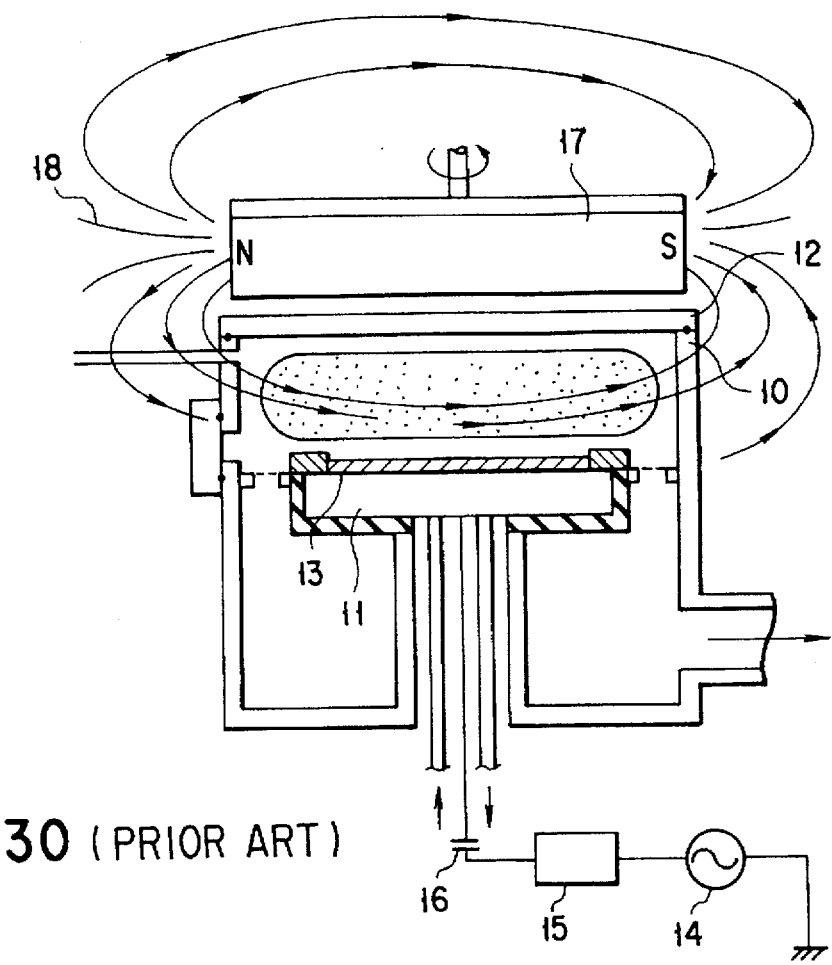
FIG. 30 is a schematic representation of a conventional magnetron RIE apparatus.
Figure 31:
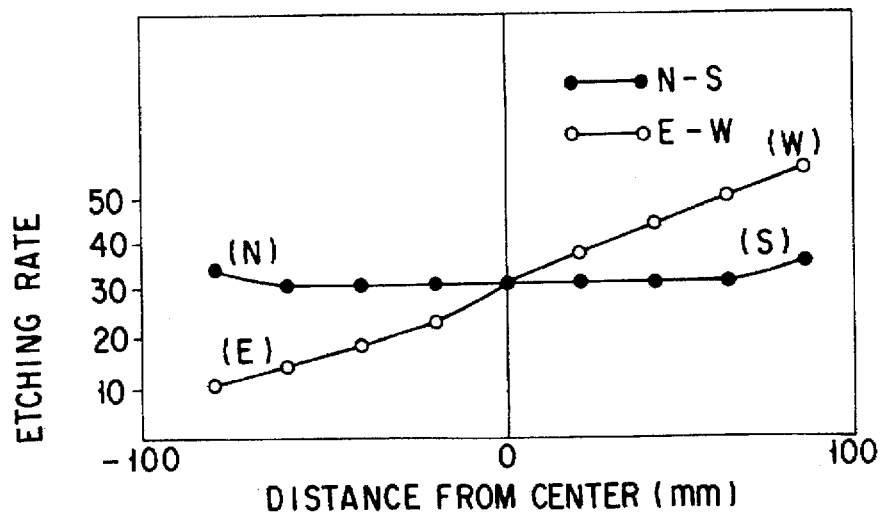
FIG. 31 is a diagram showing the etching-rate distribution on the surface of a wafer etched by another conventional magnetron RIE apparatus.

FIG. 29A illustrates how the etching-rate distribution observed when the magnet assembly 60 generated no magnetic field. FIG. 29B represents the etching-rate distribution detected when the assembly 60 generated a 30G magnetic field which had its central plane aligned with the target surface of the wafer. FIG. 29C shows the etching-rate distribution recorded when the assembly 60 generated a 60G magnetic field which had its central plane aligned with the target surface of the wafer. FIG. 29D represents the etching-rate distribution observed when the assembly 60 generated a 60G magnetic field which had its central plane located 10 mm above the target surface of the wafer. The average etching rate was 15 nm/min for the case shown in FIG. 29A, 14 nm/min for the case shown in FIG. 29B, 17 nm/min for the case illustrated in FIG. 29C, and 16.5 nm/min for the case depicted in FIG. 29D. From FIGS. 29B and 29C it is clear that the etching rate is much higher at the N-pole and S-pole sides than at the center of the wafer when a magnetic field is applied to the wafer. As can be seen from FIG. 29D, the etching rate at the N-pole and S-pole sides is moderated to be similar to that at the center of the wafer—that is, the uniformity of etching rate over the surface of the wafer is improved. The non-uniformity of etching rate along the E-W axis is prominent even for the case shown in FIG. 29D. Nonetheless, this problem can be solved by rotating the magnetic field.

In the second and third embodiment of the present invention, there is generated in the vacuum chamber a magnetic field whose central plane is shifted from the target surface of the substrate toward the second electrode and whose lines of magnetic force intersect with the target surface of the wafer. This magnetic field mitigates the non-uniform distribution of plasma density observed at the N-pole and S-pole sides. The plasma process apparatuses according to the second and third embodiment can, therefore, maintain a uniform, high-density plasma all over the target surface of the substrate.

The present invention is not limited to the embodiments described above which are etching apparatuses. It can be applied to various types of plasma process apparatus which utilize magnetron discharge. For example, the invention may be applied to a CVD apparatus or a sputtering apparatus which can form thin films. Moreover, the power supplied between the electrodes is not limited to radio-frequency power. Rather, it may be low-frequency power or DC power. Various changes and modifications can be made, without departing the scope of the present invention.

What is claimed is:

1. An apparatus for processing a target surface of a substrate, while using plasma, comprising:

a vacuum chamber for defining a process space in which said substrate is contained and processed;

a supply for introducing into said vacuum chamber a gas to be made into plasma;

an exhaustion system for exhausting said vacuum chamber;

a first electrode located within said vacuum chamber and having a support surface for supporting said substrate such that said target surface is exposed to said process space;

a second electrode having an opposing surface that opposes the support surface of said first electrode;

a power supply for applying a voltage between said first and second electrodes, thereby to make said gas into plasma and to form an electric field E which extends substantially at right angles to the target surface of said substrate supported on said support surface between said substrate and said plasma;

a magnet assembly for generating a magnetic field B having a reference plane that intersects with the electric field substantially at a right angle between said first and second electrode, wherein said magnet assembly has a plurality of magnet elements which have different magnetization axes and are arranged along an outer side surfaces of said vacuum chamber, electrons drift due to a force resulting from an outer product (E×B) of the electric field E and the magnetic field B, said magnetic field has a direction in said reference plane parallel to the target surface of said substrate supported on said support surface, and the reference plane of the magnetic field is deviated toward said opposing surface of the second electrode, from the target surface of said substrate supported on said support surface, such that the magnetic force lines of the magnetic field intersect with the target surface of said substrate; and further wherein a relation of $3° < \theta_z (\pm 100, 0) < 8°$ holds, where $\theta_z (\pm 100, 0)$ is an angle at which the magnetic force lines of the magnetic field intersect with the target surface of the substrate at a distance of 100 mm from a center of the substrate, measured along an N-S axis of the magnetic field, and a relation of $1.1 < B_{(\pm 100, 0)}/Bc < 1.3$ holds, where Bc and $B_{(\pm 100, 0)}$ are intensities that the magnetic field has at coordinates (0,0) and (±100, 0), respectively, in coordinate systems (x, y) on the target surface of the substrate, the coordinate systems (x, y) being defined with distances (mm) measured from the center of the target surface of the substrate in directions parallel to the N-S and E-W axes, respectively, of the magnetic field.

2. The apparatus according to claim 1, wherein a relation of $1.0 \leq B_{(\pm 100, y)}/B_{(0, y)} \leq 1.5$ holds, where $B_{(0, y)}$ and $B_{(\pm 100, y)}$ are intensities which the magnetic field has at coordinates (0, y) and (±100,y), respectively, in the coordinate systems (x, y) on the target surface of the substrate.

3. The apparatus according to claim 1, further comprising a conductive or semiconductive guard ring for surrounding the substrate in a fitting fashion, said guard ring having a surface exposed to the process space and aligned with said target surface of the substrate.

4. The apparatus according to claim 1, further comprising means for rotating the magnetic field in a plane parallel to the target surface of the substrate.

5. The apparatus according to claim 1, wherein said magnet elements are permanent magnets.

6. The apparatus according to claim 1, wherein said magnet elements are electromagnets.

7. The apparatus according to claim 1, wherein magnetization axes of the magnetic elements rotate twice in a circle around said vacuum chamber.

8. The apparatus according to claim 1, wherein the magnetic field has such an intensity distribution that the intensity decreases in a direction in which electrons drift due to the outer product E×B.

9. The apparatus according to claim 8, wherein a relation of $-0.6 < (Br_{(0, y)} - Bo)/(Bo \times y) < -0.4$ holds when $-100 < y < 0$, and a relation of $-0.4 < (Br_{(0,y)} - Bo)/(Bo \times y) < -0.3$ holds when $0 \leq y \leq 100$, where y is a coordinate (mm) on the target surface of the substrate, measured from the center thereof along the direction of drift, and Bo and $Br_{(0, y)}$ are intensities that the magnetic field has at positions in said reference plane, which correspond to the center of the target surface, and the coordinate y, respectively.

10. An apparatus for processing a target surface of a substrate, while using plasma, comprising:

a vacuum chamber for defining a process space in which said substrate is contained and processed;

a supply system for introducing into said vacuum chamber a gas to be made into plasma;

an exhaustion system for exhausting said vacuum chamber;

a first electrode located within said vacuum chamber and having a support surface for supporting said substrate such that said target surface is exposed to said process space;

a second electrode having an opposing surface that opposes the support surface of said first electrode;

a power supply for applying a voltage between said first and second electrodes, thereby to make said gas into plasma and to form an electric field E which extends substantially at right angles to the target surface of said substrate supported on said support surface between said substrate and said plasma;

a magnet assembly for generating a magnetic field B having a reference plane that intersects with the electric field substantially at a right angle between said first and second electrode, wherein said magnet assembly has a plurality of magnet elements which have different magnetization axes and are arranged along an outer side surfaces of said vacuum chamber, electrons drift due to a force resulting from an outer product (E×B) of the electric field E and the magnetic field B, said magnetic field has a direction in said reference plane parallel to the target surface of said substrate supported on said support surface, and the reference plane of the magnetic field is deviated toward said opposing surface of the second electrode, from the target surface of said substrate supported on said support surface, such that the magnetic force lines of the magnetic field intersect with the target surface of said substrate; and further wherein a relation of $3° < \theta_z (\pm 100, 0) < 8°$ holds, where $\theta_z (\pm 100, 0)$ is an angle at which the magnetic force lines of the magnetic field intersect with the target surface of the substrate at a distance of 100 mm from a center of the substrate, measured along an N-S axis of the magnetic field, and a relation of $1.0 \leq B_{(\pm 100, y)}/B_{(0, y)} \leq 1.5$ holds, where $B_{(0, y)}$ and $B_{(\pm 100, y)}$ are intensities which the magnetic field has at coordinates $(0,y)$ and $(\pm 100, y)$, respectively, in coordinate systems $(x, y)$ on the target surface of the substrate, the coordinate systems $(x, y)$ being defined with distances (mm) measured from the center of the target surface of the substrate in directions parallel to the N-S and E-W axes, respectively, of the magnetic field.

* * * * *

UNITED STATES PATENT AND TRADEMARK OFFICE
CERTIFICATE OF CORRECTION

PATENT NO.   : 5,717,294
DATED        : February 10, 1998
INVENTOR(S)  : Itsuko SAKAI et al.

It is certified that error appears in the above-indentified patent and that said Letters Patent is hereby corrected as shown below:

Claim 1, Col. 19, line 64, "Bc<1.3" should read --Bc≦1.3--.

Claim 10, Col. 22, line 2, "$1.0 \leq B_{(\pm 100}$" should read --$1.0 \leq B_{(\pm 100,}$--.

Signed and Sealed this

Thirty-first Day of August, 1999

Attest:

Q. TODD DICKINSON

*Attesting Officer*    *Acting Commissioner of Patents and Trademarks*